US009831008B2

(12) United States Patent
See et al.

(10) Patent No.: US 9,831,008 B2
(45) Date of Patent: Nov. 28, 2017

(54) INORGANIC NANOSTRUCTURE-ORGANIC POLYMER HETEROSTRUCTURES USEFUL FOR THERMOELECTRIC DEVICES

(71) Applicant: The Regents of the University of California, Oakland, CA (US)

(72) Inventors: Kevin C. See, Medford, MA (US); Jeffrey J. Urban, Emeryville, CA (US); Rachel A. Segalman, Pleasanton, CA (US); Nelson E. Coates, Oakland, CA (US); Shannon K. Yee, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 194 days.

(21) Appl. No.: 13/685,505

(22) Filed: Nov. 26, 2012

(65) Prior Publication Data
US 2013/0084464 A1    Apr. 4, 2013

Related U.S. Application Data

(63) Continuation of application No. PCT/US2011/037816, filed on May 24, 2011.

(60) Provisional application No. 61/347,549, filed on May 24, 2010.

(51) Int. Cl.
| | |
|---|---|
| *H01B 1/12* | (2006.01) |
| *H01L 35/24* | (2006.01) |
| *H01L 51/00* | (2006.01) |
| *B82Y 30/00* | (2011.01) |

(52) U.S. Cl.
CPC ............. *H01B 1/128* (2013.01); *H01L 35/24* (2013.01); *B82Y 30/00* (2013.01); *H01L 51/0037* (2013.01); *Y10S 977/755* (2013.01); *Y10T 428/12569* (2015.01); *Y10T 428/294* (2015.01); *Y10T 428/2933* (2015.01)

(58) Field of Classification Search
CPC ........... Y10T 428/294; Y10T 428/2933; Y10T 428/12569; Y10S 977/755; H01L 35/24
USPC ........................................................ 428/323
See application file for complete search history.

(56) References Cited

U.S. PATENT DOCUMENTS

| | | | |
|---|---|---|---|
| 5,035,926 A | 7/1991 | Jonas et al. | |
| 5,973,050 A * | 10/1999 | Johnson et al. | 524/439 |
| 6,759,587 B2 | 7/2004 | Toshima et al. | |
| 2006/0274049 A1 | 12/2006 | Spath | |

(Continued)

FOREIGN PATENT DOCUMENTS

| | | |
|---|---|---|
| WO | WO 2008/140845 A1 | 11/2008 |
| WO | WO 2009/085362 A2 | 7/2009 |
| WO | WO 2010/052704 A2 | 5/2010 |

OTHER PUBLICATIONS

Kevin C. See et al., "Water-Processable Polymer-Nanocrystal Hybrids for Thermoelectrics," Nano Lett. 10, 4664-4667 (Oct. 5, 2010).

(Continued)

*Primary Examiner* — Samir Shah

(57) ABSTRACT

The present invention provides for an inorganic nanostructure-organic polymer heterostructure, useful as a thermoelectric composite material, comprising (a) an inorganic nanostructure, and (b) an electrically conductive organic polymer disposed on the inorganic nanostructure. Both the inorganic nanostructure and the electrically conductive organic polymer are solution-processable.

13 Claims, 17 Drawing Sheets

(56) References Cited

U.S. PATENT DOCUMENTS

| | | | |
|---|---|---|---|
| 2008/0015284 A1 | 1/2008 | Cakmak | |
| 2008/0018232 A1 | 1/2008 | Zhang | |
| 2008/0128688 A1* | 6/2008 | Pan et al. ........................ | 257/40 |
| 2008/0232037 A1* | 9/2008 | Biler ............................ | 361/529 |
| 2008/0241262 A1* | 10/2008 | Lee et al. ..................... | 424/490 |
| 2009/0057620 A1* | 3/2009 | Holliday et al. .............. | 252/500 |
| 2009/0176159 A1 | 7/2009 | Zhamu | |

OTHER PUBLICATIONS

Ling Li et al., "Preparation of AgcoreAushell nanowires and their surface enhanced Raman spectroscopic studies," Acta Chimica Sinica, vol. 65, No. 9, 779-784 (May 5, 2007) Abstract.

Aditi Risbud, "Berkeley Lab Scientists Generate Low-Cost, Hybrid Thermoelectrics," Lawrence Berkeley Lab Newcenter (Nov. 5, 2010).

Keng-Hoong Yim et al., "Controlling Electrical Properties of Conjugated Polymers via a Solution-Based p-Type Doping," Advanced Materials vol. 20, 3319-3324, (Aug. 26, 2011).

Adam Pron et al., "Processible conjugated polymers: from organic semiconductors to organic metals and superconductors," Progress in Polymer Science, vol. 27, 135-190 (2002).

PCT/US2001/037816 International Search Report and Written Opinion, (dated Sep. 13, 2011).

* cited by examiner

Exfoliation    Intercalation

Chemical Details of Exfoliation

$MX_2 + n\text{-BuLi} \rightarrow Li_xMX_2 + C_8H_{18}$ $Li_xMX_2 + H_2O/MeOH \rightarrow MX_2 + H_2 + LiOH\ (LiOMe)$

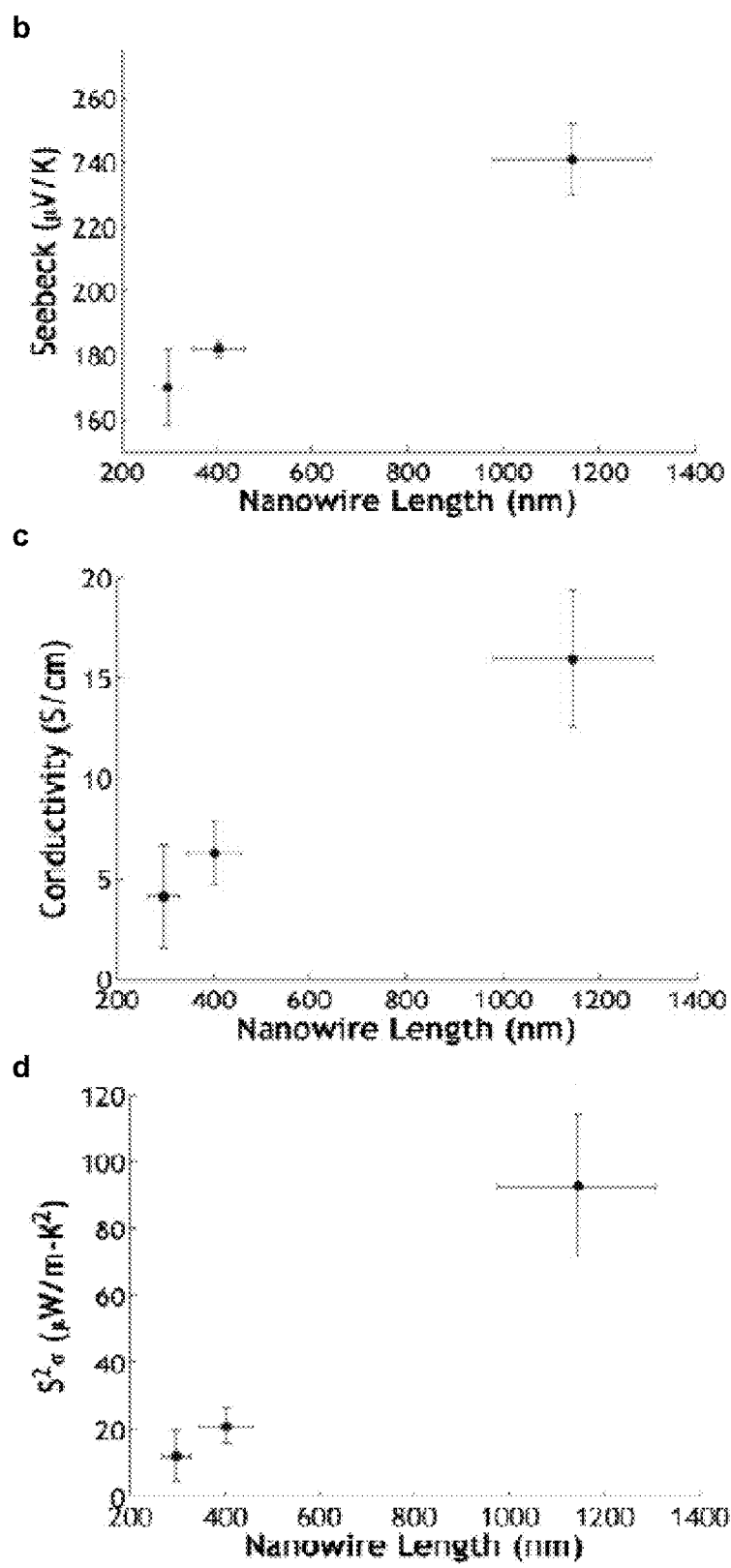
Figure 19 b-d

INORGANIC NANOSTRUCTURE-ORGANIC POLYMER HETEROSTRUCTURES USEFUL FOR THERMOELECTRIC DEVICES

CROSS-REFERENCE TO RELATED APPLICATIONS

This application claims priority as a continuation application to PCT International Patent Application No. PCT/US2011/037816, filed May 24, 2011, which claims priority to U.S. Provisional Patent Application Ser. No. 61/347,549, filed May 24, 2010, which are hereby incorporated by reference in their entireties.

STATEMENT OF GOVERNMENTAL SUPPORT

The invention described and claimed herein was made in part utilizing funds supplied by the U.S. Department of Energy under Contract No. DE-AC02-05CH11231. The government has certain rights in this invention.

FIELD OF THE INVENTION

This invention relates generally to inorganic nanostructure-organic polymer heterostructures.

BACKGROUND OF THE INVENTION

Nanostructuring of bulk materials has led to significant improvements in the thermoelectric figure of merit, ZT, through the introduction of phonon scattering interfaces and energy-dependent scattering of carriers.[1] While valuable, these advances have typically required complex materials fabricated using energy-intensive, high-temperature, expensive processing methods. Here, the benefits of nanostructuring in high performance thermoelectric materials are realized in solution-processable polymer-inorganic composite materials. Cooperative transport combining the large Seebeck coefficient of colloidal inorganic Tellurium (Te) nanocrystals and the very high electrical conductivity of a conjugated polymer results in a composite material with an amplified thermoelectric power factor $S^2\sigma$ while retaining polymeric thermal conductivity. Our measured ZT~0.2 is the largest reported value of ZT for a material processed entirely from water, and the largest reported in an organic or organic/inorganic composite to date. Currently there is no approach to producing stable, high performance solution processable thermoelectric materials.

Recently, there has been considerable focus on development of solution-processable optoelectronic materials, driven by substantial reductions in processing and manufacturing costs enabled by high throughput, large area processes such as spray coating and printing.[2] Despite this active body of research, there has been little focus on developing these tools for thermoelectrics, a class of energy conversion devices with high module processing costs.

In response to this, focus on the thermoelectric transport properties of soluble conjugated molecules and colloidal quantum dots has intensified, however neither system alone seems capable of achieving stable, competitive values of ZT due to their intrinsic transport properties.[3] In the case of conducting polymers, volatile doping techniques result in high electrical conductivities but low thermopowers.[3a,d,f] In the case of nanocrystals, high thermopowers have been reported, but high electrical conductivities have only been achieved using high temperature post processing at the expense of thermopower.[4] In both of these established classes of solution-processable electronic materials, there exists no obvious strategy to stably improve the intrinsic power factor of either system, limiting the applicability of either one, individually, as thermoelectric materials. Recently, all organic composites of carbon nanotubes and conjugated polymers have demonstrated intriguing composite properties, but a maximum ZT of only 0.02.[5]

BRIEF DESCRIPTION OF THE INVENTION

The present invention provides for an inorganic nanostructure-organic polymer heterostructure, useful as a thermoelectric composite material, comprising (a) an inorganic nanostructure, and (b) an electrically conductive organic polymer disposed on the inorganic nanostructure. In some embodiments of the invention, the heterostructure comprises (a) a plurality of inorganic nanostructures, and (b) a plurality of electrically conductive organic polymers disposed on the plurality of inorganic nanostructures. Both the inorganic nanostructure and the electrically conductive organic polymer are water-soluble or solution-processable. In some embodiments, the plurality of inorganic nanostructures comprises colloidal nanoparticles or nanocrystals.

In some embodiments of the invention, the heterostructure comprises a first layer comprising the organic polymer disposed on a second layer comprising the inorganic nanostructure. In some embodiments of the invention, the heterostructure comprises a plurality of alternating layers of the organic polymer and the inorganic nanostructure. In some embodiments of the invention, the two outermost layers of the heterostructure are layers of the inorganic nanostructure. In some embodiments of the invention, the thickness of the organic polymer layer(s) is from about 2 nm to 4 nm. In some embodiments of the invention, the thickness of the organic polymer layer(s) is about 3 nm.

The present invention provides for a method of making the heterostructure of the present invention comprising: (a) providing a layered inorganic nanostructure, (b) exfoliating the layered inorganic nanostructure, (c) adding an organic polymer such that the organic polymer intercalates with the exfoliated inorganic nanostructure. FIG. 14 shows an embodiment of this method.

The present invention also provides for a method of making the heterostructure of the present invention comprising: (a) providing a solution comprising the organic polymer and the metal, metalloid, bimetal, metal-metalloid compound, or metal-non-metal compound of the inorganic nanostructure in solution, (b) incubating the mixture to allow for the inorganic nanostructure to form, and (c) film depositing the organic polymer and the inorganic nanostructure such that a heterostructure comprising a layer of the organic polymer and a layer of the inorganic nanostructure is formed. The providing step (a) can comprise adding the organic polymer and the metal, metalloid, bimetal, metal-metalloid compound, or metal-non-metal compound of the inorganic nanostructure into a solvent/solution to form the solution of step (a). The adding step can further comprise vigorous stirring or agitation to dissolve the metal, metalloid, bimetal, metal-metalloid compound, or metal-non-metal compound of the inorganic nanostructure. The incubating step (b) can further comprising heating, such as to the temperature of 90° C. the solution of step (a) and/or incubating for overnight. In some embodiments, the inorganic nanostructures are nanorods or nanowires. One embodiment of the method is described in Example 1 herein. In some embodiments of the invention, the method can further comprise altering, reducing, increasing, or optimizing the ZT of the heterostructure by performing one of more of the steps described herein, including, but not limited to, providing a desired aspect ratio of the nanostructure, providing a desired length of the nanostructure, using an in situ solvent during and/or after the synthesis of the heterostructure, adding a high conductivity polymer to the nanostructure and/or organic polymer, and aligning the anisotropic alignment of the nanostructure.

The present invention provides for a device comprising the heterostructure of the present invention. In some embodiments of the invention, the device is a thermoelectric energy convertor, battery, or capacitor.

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION OF THE INVENTION

Figure 1:
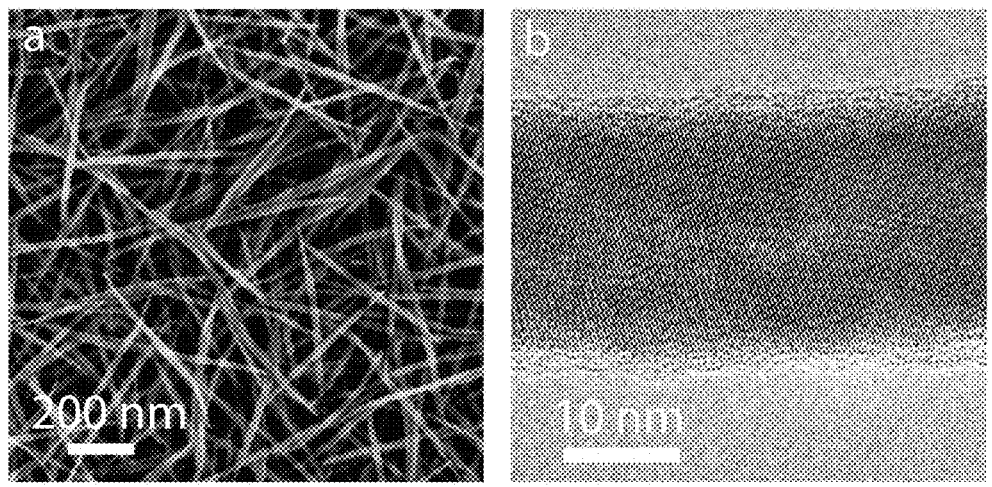
FIG. 1 shows (a) a SEM image of a drop cast composite nanorod film, and (b) a TEM image showing the crystalline Te nanorod passivated with PEDOT:PSS.

Before the present invention is described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "and", and "the" include plural referents unless the context clearly dictates otherwise. Thus, for example, reference to "a nanostructure" includes a plurality of such nanostructures, and so forth.

Heterostructures of the Present Invention

The inorganic nanostructure comprises a single metal or metalloid, bimetal, metal-metalloid compound, or metal-non-metal compound. The inorganic nanostructure can be a layer, such as a thin film, a nanorod, a nanocrystal, a nanowire, or the like. The inorganic nanostructure has a layered crystal structure. Suitable metals include, but are not limited to, transition metals and Group 13-16 metals. Suitable inorganic nanostructures that are bimetal include, but are not limited to, a wire of a first metal coated by a layer of a second metal, such as an Ag wire with a coaxial shell of Au. Suitable transition metals include, but are not limited to, Sc, Ti, Nb, Mo, W, Pd, Cu, Ag, Au, Zn, Cd, and Hg. Suitable Group 13-16 metals include, but are not limited to, In, Ge, Sn, Sb, and Bi. A suitable metalloid is Te. Suitable metal-non-metal compounds include, but are not limited to, ZnTe, GeTe, $Sb_2Te_3$, $Bi_2Te_3$, PbTe, $Sb_2S_3$, $Bi_2S_3$, $SnS_2$, $Cu_2S$, $TaS_2$, PbS, $Bi_2Se_3$, PbSe, $CdSe,SnSe_2$, $NbSe_2$, $In_2Se_3$, $GeSe_2$, InSb, $CuInSe_2$, $CuInTe_2$, $TiS_2$, and $MoS_2$. Some suitable metals, such as Te, are narrow bandgap semiconductors with a range of thermoelectric properties that depend sensitively on its preparation conditions, due to their high sensitivity to small amounts of impurities. In some embodiments of the invention, the inorganic compound is a 1-D nanostructure, such as a nanorod or nanowire. For Te, 1-D growth is advantageous because of its anisotropic crystal structure.

The organic polymer is any polymer, including homopolymers and copolymers, or oligomer that is inherently or intrinsically capable of electrical conductivity without the addition of carbon black or conductive metal particles. The organic polymer comprises a suitable conjugated polymer that is at least semi-conducting (i.e., having an electrical conductivity equal to or greater than 1 S/cm) and has suitable water solubility properties. In some embodiments, the organic polymer has an electrical conductivity equal to or greater than 10 S/cm. In some embodiments, the organic polymer has an electrical conductivity equal to or greater than 100 S/cm. Suitable organic polymers include, but are not limited to, a polythiophene (PT), polyalkylthiophene, polysulfonate, poly(sulfonic acid), polyaniline, polyacetylene, polypyrrole, poly(p-phenyllene sulfide), poly(p-phenylene vinylene) (PPV), polyindole, polypyrene, polycarbazole, polyazulene, polyazepine, polyfluorene, polynaphthalene, fullerene derivative, or a doped conjugated polymer thereof. A suitable polythiophene (PT) is poly(3,4-ethylenedioxythiophene) poly(styrenesulfonate) (PEDOT:PSS) (which is commercially available from H. C. Starck GmbH; Goslar, Germany). PEDOT:PSS is a commonly used conducting polymer that is available commercially as colloidal dispersion, typically in water. As received, cast films typically have conductivities in the range of 0.1 to 1 S/cm, however it has been shown treatment with polar solvents (such as, DMSO or ethylene glycol) result in up to a 2 order of magnitude increase in the conductivity.

A suitable polythiophene has the structure:

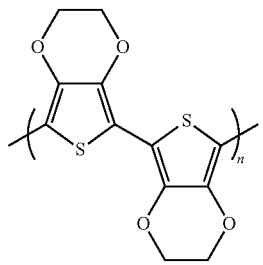

Another suitable polythiophene has the structure:

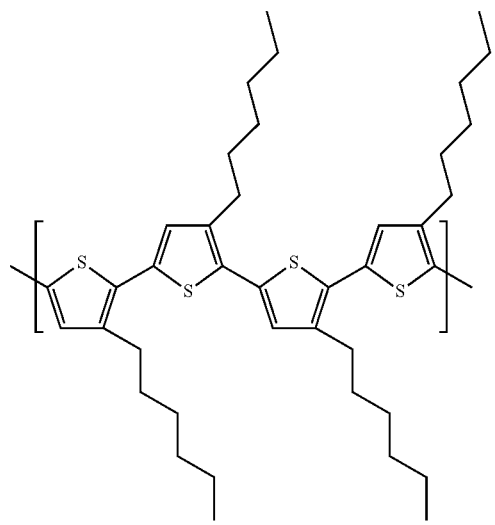

A suitable polyaniline has the structure:

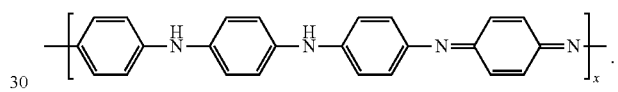

Suitable dopants for doping the organic polymer include, but are not limited to, tetrafluorotetracyanoquinodimethane ($F_4$-TCNQ) (which is commercially available from Sigma-Aldrich; St. Louis, Mo.).

In some embodiments of the invention, the heterostructure comprises a solution processable conducting polymer/inorganic composite nanocrystals with excellent room temperature thermoelectric properties that exceed the performance of either component individually. In one embodiment, the heterostructure comprises tellurium nanorods passivated with the conducting polymer PEDOT:PSS that can be cast into high quality films giving values for the thermoelectric figure of merit ZT near 0.2, which is unprecedented for materials processed directly from water. The composite nanorods overcome the intrinsic limitations of both conjugated organics and colloidal nanocrystals alone by combining the high conductivity of conducting polymers with the high thermopower of colloidal nanocrystals. In combination with a remarkably low thermal conductivity, excellent room temperature thermoelectric properties are achieved without further processing. Electron microscopy in combination with elemental analyses confirms passivation of the crystalline rod with a thin layer of the conducting organic polymer, and further optimization of the morphology may be a path forward to even higher ZTs.

Synthesis of the heterostructure or composite nanostructures can be achieved by developing synthetic methods involving soluble polymers, where standard techniques involve surfactants; in both cases processing is accomplished in water using ascorbic acid as a reducing agent.[4] As with most syntheses of this type, the original synthesis calls for the use of surfactant which guides the growth the particle, in the literature case it was cetyltrimethylammonium bromide (CTAB). In the present invention, this surfactant is replaced with the conducting polymer PEDOT:

PSS. The morphology can be varied depending on the concentration of polymer utilized, however a typical synthesis results in rods about 5 nm in diameter and about 50 nm in length. See Example 1.

The heterostructure can be solution-processable, i.e., the processing of the heterostructure can be performed in solution, such as in water or another benign solvent, such that it can performed in a one-pot, in situ preparation. The inorganic nanostructures can be formed by colloidal synthesis and then coated with the electrically conductive organic polymer. The resulting heterostructure is stable in solution and be further processed from solution into films or thin layers, for example, via a printing process. Such films or layers have an enhanced thermoelectric property of merit ZT relative to any of the individual components. In some embodiments of the invention, the heterostructure has a ZT value equal to or greater than 0.1 at room temperature. The solution-processable heterostructures have the advantage of keeping the cost of processing low and allows for high-throughput, large area processes, such as printing, spray coating, drop-casting, roll-to-roll processing, and the like.

The heterostructure can have thermoelectric properties about similar to or better then bismuth telluride. The heterostructures can be cheaply manufactured and are amendable to low cost solution processing.

In one embodiment of the invention, Te nanostructures, such as 1-D nanorods, are coated with the conducting polymer poly(3,4-ethylenedioxythiophene): poly(styrenesulfonate) (PEDOT:PSS). Organic/inorganic interface formation takes place in-situ during synthesis, resulting in composite nanostructures directly processable from solution. The resulting heterostructures are soluble in water and can be cast from solution into high quality films with excellent thermoelectric properties.

The present invention comprises the development of solution-processable thermoelectric composite materials. These composite materials can comprise a conducting polymer and inorganic nanocrystals. The entire processing is performed in solution (i.e., water and other benign solvents), in a one-pot, in-situ preparation. The inorganic nanocrystals are formed by colloidal synthesis then coated with a conducting polymer; the resulting composite materials are stable in solution and can be processed from solution into films, e.g. via a printing process. These films display an enhanced thermoelectric figure of merit ZT relative to either of the individual components. The ZT value of the material is equal to or greater than 0.1 at room temperature, which is unprecedented in any solution-processed material or any material containing an organic (polymeric/low cost) component.

Previous work has shown the potential for nanostructured systems to overcome the limitations of bulk materials, enabling improvements in the thermoelectric figure of merit ZT. The expression for ZT is:

$$\frac{S^2 \sigma T}{\kappa},$$

where S is the Seebeck coefficient (or thermopower), $\sigma$ is the electrical conductivity, and K the thermal conductivity. Presently, the highest manufacturable values of ZT are ~1. Wide deployment of thermoelectrics has been limited by the high-temperature, high-cost manufacturing methods required for current state-of-the-art materials (e.g. Sb- and Sn-doped versions of bulk $Bi_2Te_3$).

The solution-processable materials are suitable for high-throughput, large area processes, such as printing, spray coating, drop-casting, roll-to-roll processing, and the like. The present invention provides high energy conversion efficiency materials (ZT ~0.1, with a direct path to higher ZT) in a solution-processable form. In some embodiments of the invention, the inorganic nanostructure-organic polymer heterostructure has a ZT equal to or greater than about 0.1, 0.2, or 0.3 at room temperature. In some embodiments of the invention, the inorganic nanostructure-organic polymer heterostructure has a ZT equal to or greater than about 0.4, 0.5, 0.6, or 0.7 at room temperature. In some embodiments of the invention, the inorganic nanostructure-organic polymer heterostructure has a ZT equal to or greater than about 0.8 or 1.0 at room temperature.

In some embodiments of the invention, the inorganic nanostructure-organic polymer heterostructure of the present invention comprise an inorganic nanostructure having an elongated structure, such as a nanowire or nanorod, wherein the ZT of the heterostructure increases as the aspect ratio of the elongated structure (length versus radius) is increased. Suitable aspect ratios include those of a value equal to or greater than about 2, 5, 10, 50, or 100. The nanostructures having an elongated structure can have a length, a plurality of the elongated structures have an average length of, equal to or greater than about 50 nm, 100 nm, 500 nm, 1000 nm, or 2000 nm. In some embodiments of the invention, the elongated structure has a length from about 100 nm to about 2000 nm. In some embodiments of the invention, a plurality of the elongated structures, or a majority thereof or 90% thereof, has an average length of, or fall within the range of, about 100 nm to about 2000 nm.

The connectivity of conduction through the heterostructure and the amount of interfacial area available for interaction between the components can be varied. The ZT of the heterostructure can be increased by the use of in situ solvent doping during or after the synthesis of the heterostructure. Such suitable solvents include, but are not limited to, a polyol, such as a diol as ethylene glycol, or a polar aprotic solvent, such as dimethyl sulfoxide (DMSO). Electrochemical doping of the polymer with a Group 1 element, such as Lithium or Potassium, or with a Group 17 element, such as Chlorine or Iodine, is also a route to increase the ZT of the heterostructure. The ZT of the heterostructure can be increased by post filling the inorganic nanostructure portion of the heterostructure, the organic polymer portion of the heterostructure, or the entire, substantial portion or portion of the heterostructure with a suitable high conductivity polymer or mixture thereof. Such suitable high conductivity polymers include, but are not limited to, polyacetylene, polyalkylthiophene, or a doped polymer thereof. The ZT of the heterostructure can be increased by anisotropic alignment (such as by drying/annealing kinetics, electric fields, magnetic fields, and/or physical gradient) of the elongated structures, such as the nanowire or nanorods, in a direction orthogonal to that of electronic transport of the heterostructure. Overall, the result is an increased ability to increase S (thermopower) while balancing electrical and thermal conductivity (sigma and kappa, respectively) and therefore optimize the ZT of the hetero structure.

Tellurium is a ubiquitous element in many of the highest performing thermoelectric compounds at various temperatures (e.g. $Bi_2Te_3$, $Sb_2Te_3$, and PbTe). Alone, it is a narrow bandgap semiconductor with a range of thermoelectric properties that depend sensitively on its preparation conditions, due its intrinsically high sensitivity to small amounts of tellurate impurities. There are numerous reports of aqueous syntheses of 1-D Tellurium nanostructures in literature, as 1-D growth is useful due to its anisotropic crystal structure. While the synthesis of these structures is well known, there is little reported regarding the properties of these structures, in particular their thermoelectric properties.

The presented system is only one example of possible composite involving colloidal nanostructures and conducting polymers. Each component allows for a tremendous amount of variation in their structure and thus in their electronic energy levels. This is important as one potential explanation for the enhanced properties of the composite is a carrier filtering effect, where the offset between the energy levels of each of the two components results in a manipulation of the energy-dependence of the carrier distributions, which results in enhanced electronic power factor ($S^2\sigma$). Regarding the polymer, many variations on the monomer structure can be introduced, including electron withdrawing and electron donating substituents, which would vary the electronic structure of the polymer. Various functionalities can be introduced either to the backbone or as a counter-ion which would affect the solubility of the polymer.

Electropolymerization onto a predeposited film of nanoparticles can also be performed, as electropolymerized films of PEDOT:PSS are known to result in very high conductivity films. On the nanostructure side, there are numerous ways to vary the size, shape and composition of inorganic nanoparticles, giving excellent control of the electronic properties and transport. Spheres, cubes, rods and tetrapods, among other shapes are all available synthetically for a number of inorganic elements and compounds that may result in enhanced thermoelectric properties when combined with the appropriate conducting polymer. Size control has been well displayed in spheres of PbSe for example, where the resulting tunability in thermoelectric properties. Size-dependence of nanoparticle energy levels is very nicely displayed in both the PbSe and CdSe systems, where the peak in optical absorption spectra shifts predictably as a result of the degree of confinement (i.e., particle size). There is additional flexibility in materials selection as it is not necessary to synthesize the nanoparticles in the presence of the polymer as shown in the initial demonstration. It is also possible to combine the polymer and nanoparticle post synthesis, provided they are mutually soluble in the same solvent, allowing for homogeneous mixing of the two components. There is great flexibility in tuning the solubility of the nanoparticle to match that of the polymer, as a simple exchange of the ligands on the surface of the particles allows for, e.g. inducing water solubility in a particle that was previously only soluble in organic solvents as synthesized. The ability to control both polymer architecture and polymer properties, such as nanoparticle shape, size and solubility, allow for further optimization of the present invention resulting in even higher ZTs.

The present invention has one or more of the following advantages:

(1) The present invention allows for the fabrication of thermoelectric thin films with stable room temperature ZTs on the order of 0.1. The heterostructures are stable on exposure to air and/or water. The heterostructure can be synthesized and processed from water as well as exposed to air prior to measurement.

(2) The ability to process films from solution is a powerful advantage in terms of processing cost, as well as allowing high tunability of film thickness. This is especially important in the fabrication of thin film Peltier coolers, where the most efficient cooling occurs at precise film thicknesses. Typically it is very difficult to achieve this type of control using the leading bulk materials as it requires cutting down bulk pieces of parent materials or harsh ball-milling techniques which disrupt crystal quality.

(3) Nanostructuring has been demonstrated as a means to improve the thermoelectric properties of bulk materials. While enhancement was originally proposed to come from manipulation of carrier energy distributions due to quantum confinement, it was found that nanostructuring most often lead to increased scattering of phonons, which led to a decrease in thermal conductivity and was the origin of the experimentally realized improvement in ZT. Nanoparticle ensembles have been explored as potential ways to exploit the expected enhancement of electronic properties (S, $\sigma$) in confined structures, however these systems suffer from low electrical conductivities because they are typically synthesized with insulating organic ligands separating the particles. Harsh chemical treatments are needed to remove these ligands and bring these particles closer together which result in cracked films that require subsequent re-coatings and treatments. Even after this, the resulting films still have conductivities that are much lower than a doped polymer film. The present invention can overcome the difficulties of these colloidal particle ensembles by passivating the particles during synthesis with a conducting moiety which enhances the conductivity of the film yet still preserves the high thermopower of the inorganic nanostructures. The result is a film that displays a high S, low $\sigma$ and a low $\kappa$, all from materials that are processed from an aqueous solution.

Device Comprising a Heterostructure of the Present Invention

The present invention also provides for the use of any of the devices of the present invention. The present invention also provides for the method of making of any of the devices of the present invention.

The heterostructure of the present invention can be used in the thermoelectrics industry. The cost advantage realized from solution processing is applicable for both thermoelectric power generation as well as cooling. Some of the devices of the present invention are suitable for low grade heat generated in cases where cost is imperative. These include, but are not limited to, waste heat power generation from Li batteries in consumer electronics, active cooling in microelectronics including microchips and solid-state lighting, and active cooling/heating in consumer products. Another application for the heterostructures of the present invention is as a transparent electrode material for photovoltaic cells.

In some embodiments, the device further comprises a first end of the heterostructure at a first temperature; a second end of the heterostructure at a second temperature less than the first temperature, the second end opposite the first end; an electrical connection between the first end and the second end.

In some embodiments, a first heterostructure acts as a first electrode and the device further comprises: a second heterostructure acting as a second electrode in electrical communication with the first electrode; an electrolyte material between the inorganic nanostructures and the organic polymer and extending continuously from the first electrode to the second electrode.

Figure 18:
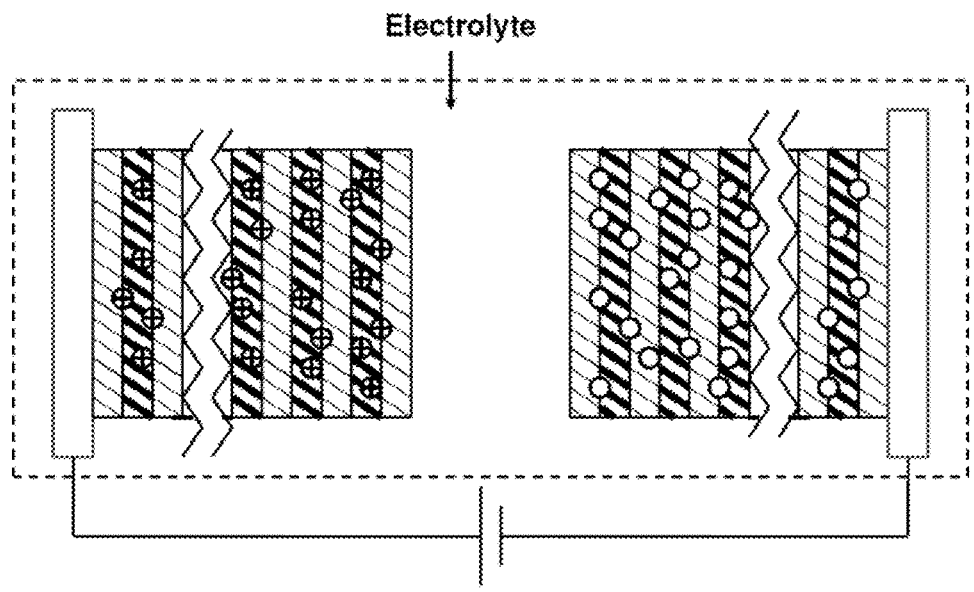
FIG. 18 shows one embodiment of how novel electrodes made of the heterostructures can be used as capacitor plates.

In some embodiments, the first heterostructure acts as a first capacitor plate and further comprising: a second heterostructure acting as a second capacitor plate; an electrolyte material between the inorganic nanostructures and the organic polymer and continuously extending continuously from the first plate to the second plate; an electrical connection between the first plate and the second plate, the electrical connection capable of maintaining an applied potential difference between the first plate and the second plate. An embodiment of this device is shown in FIG. 18.

Figure 16:
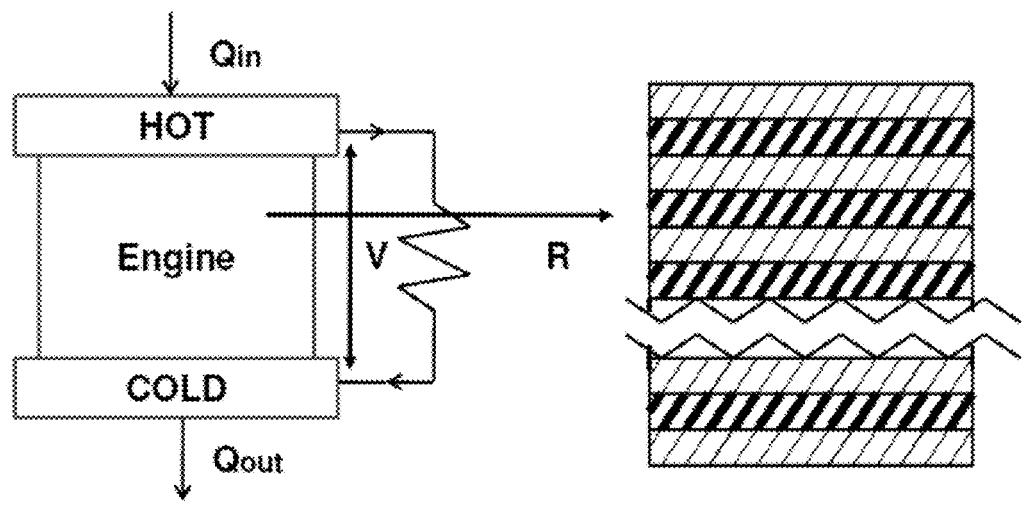
FIG. 16 shows one embodiment of how the thermoelectric heterostructure can be used to convert waste heat into electricity.

The present invention also provides for a thermoelectric energy converter, comprising: (a) a heterostructure comprising alternating layers of a plurality of inorganic nanostructure layers and a plurality of electrically conductive organic polymer layers; (b) a first end of the heterostructure at a first temperature; (c) a second end of the heterostructure at a second temperature less than the first temperature, the second end opposite the first end; and (d) an electrical connection between the first end and the second end. An embodiment of the thermoelectric energy converter is shown in FIG. 16.

The present invention also provides for a battery, comprising: (a) a first heterostructure electrode, (b) a second electrode in electrical communication with the first electrode; and (c) an electrolyte material between the inorganic nanostructures and the organic polymer and extending continuously from the first electrode to the second electrode.

Figure 17:
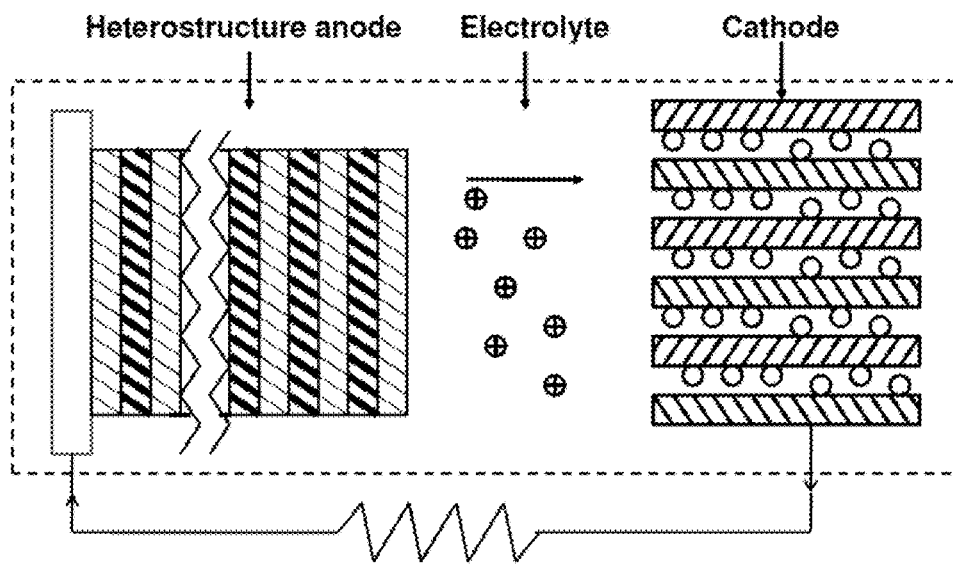
FIG. 17 shows one embodiment of how novel electrodes made of the heterostructures can be used as electrodes in a battery.

FIG. 17 shows how novel electrodes made of the heterostructures of the present invention can be used in a battery. The heterostructure of the present invention is used to increase the energy density of batteries. In one exemplary embodiment, the heterostructure is used as an anode in a lithium ion battery. The conducting organic polymer provides a route for easy transport of electrons as the $Li^+$ ions are transported in the electrolyte. The electrodes allow storage of much more lithium per unit mass of the anode than can traditional anodes currently used in lithium ion batteries. Moreover, the heterostructure electrodes made of materials appropriate for the system can be used in other battery systems as well.

The present invention also provides for a capacitor, comprising: (a) a first capacitor plate comprising the heterostructure of the present invention; (b) a second capacitor plate comprising the heterostructure of the present invention; (c) an electrolyte material within the heterostructure in both the first plate and the second plate and continuously extending continuously from the first plate to the second plate; and (d) an electrical connection between the first plate and the second plate, the electrical connection capable of maintaining an applied potential difference between the first plate and the second plate.

FIG. 18 shows a double layer capacitor comprising plates (electrodes) made of the heterostructure of the present invention. The surface area of the heterostructure of the present invention can be extremely high, thus the surface area of the electrodes made using the heterostructure can be also extremely high per unit volume or weight. The amount of charge that can be stored in a capacitor is directly proportional to the surface area of the electrodes. Capacitors such as the example shown in FIG. 18 can store much more charge per unit area of electrode than is possible at present with conventional electrodes made of activated carbon used in double layer capacitors.

These and other objects, advantages, and features of the invention will become apparent to those persons skilled in the art upon reading the details of the invention as more fully described below.

References cited:
(1) (a) Dresselhaus, M. S.; Chen, G.; Tang, M. Y.; Yang, R. G.; Lee, H.; Wang, D. Z.; Ren, Z. F.; Fleurial, J. P.; Gogna, P. Adv. Mat. 2007, 19, 1043-1053. (b) Poudel, B.; Hao, Q.; Ma, Y.; Lan, Y. C.; Minnich, A.; Yu, B.; Yan, X.; Wang, D. Z.; Muto, A.; Vashaee, D.; Chen, X. Y.; Liu, J. M.; Dresselhaus, M. S.; Chen, G.; Ren, Z. Science 2008, 320, 634-638. (c) Harman, T. C.; Taylor, P. J.; Walsh, M. P.; LaForge, B. E. Science 2002, 297, 2229-2232.

(2) (a) Yan, H.; Chen, Z. H.; Zheng, Y.; Newman, C.; Quinn, J. R.; Dotz, F.; Kastler, M.; Facchetti, A. Nature 2009, 457, 679-U1. (b) Cho, J. H.; Lee, J.; Xia, Y.; Kim, B.; He, Y.; Renn, M. J.; Lodge, T. P.; Daniel Frisbie, C. Nat Mater 2008, 7, 900-906.

(3) (a) Shakouri, A.; Suquan, L 1999. Eighteenth Int. Conf. on Thermoelectrics 1999, p 402-406. (b) Reddy, P.; Jong, S. Y.; Segalman, R. A.; Majumdar, A. Science 2007, 315, 1568-1571. (c) Wang, R. Y.; Feser, J. P.; Lee, J.-S.; Talapin, D. V.; Segalman, R.; Majumdar, A. Nano Lett. 2008, 8, 2283-2288. (d) Aich, R. B.; Blouin, N.; Bouchard, A.; Leclerc, M. Chem. Mat. 2009, 21, 751-757. (e) Jiang, F.-X.; Xu, J.-K.; Lu, B.-Y.; Xie, Y.; Huang, R.-J.; Li, L.-F. Chin. Phys. Lett. 2008, 2202. (f) Hiroshige, Y.; Ookawa, M.; Toshima, N. Synth. Met. 2007, 157, 467-474.

(4) Marcus, S.; Niels, O.; Katrin, M.; Andreas, K.; Christian, K.; Horst, W. Adv. Func. Mat. 2009, 19, 3476-3483.

(5) Kim, D.; Kim, Y.; Choi, K.; Grunlan, J. C.; Yu, C. ACS Nano 2009.

(6) (a) Michaelson, H. B. J. Appl. Phys. 1977, 48, 4729-4733. (b) Hwang, J.; Amy, F.; Kahn, A. Org. Elec. 2006, 7, 387-396.

(7) (a) Humphrey, T. E.; Dwyer, M. F. O.; Linke, H. J. Phys. D 2005, 2051. (b) Vashaee, D.; Shakouri, A. Phys. Rev. Lett. 2004, 92, 106103.

(8) Xi, G.; Liu, Y.; Wang, X.; Liu, X.; Peng, Y.; Qian, Y. Cryst. Grow. & Des. 2006, 6, 2567-2570.

(9) Chang, K.-C.; Jeng, M.-S.; Yang, C.-C.; Chou, Y.-W.; Wu, S.-K.; Thomas, M.; Peng, Y.-C. J. Elec. Mat. 2009.

(10) P. Gonsalves, A.; Lopes, E. B.; Alves, E.; Barradas, N. P.; Franco, N.; Rouleau, O.; Godart, C. In Prop. and Appl. of Thermoelec. Mat. 2009, p 51-67.

(11) Ouyang, J.; Xu, Q.; Chu, C.-W.; Yang, Y.; Li, G.; Shinar, J. Polymer 2004, 45, 8443-8450.

EXAMPLE 1

Figure 3:
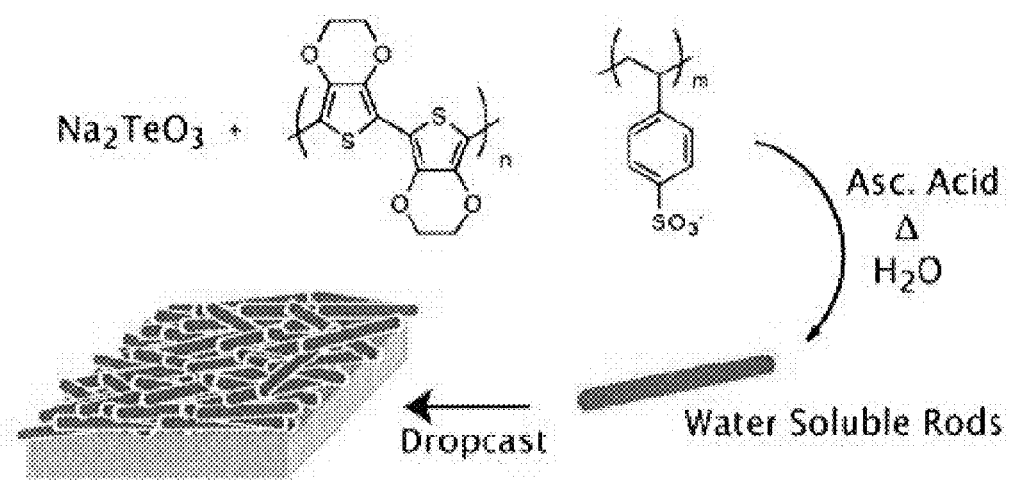
FIG. 3 shows a method for the synthesis of PEDOT:PSS passivated Te nanorods, followed by formation of smooth nanocomposite films during solution casting.
Figure 8:
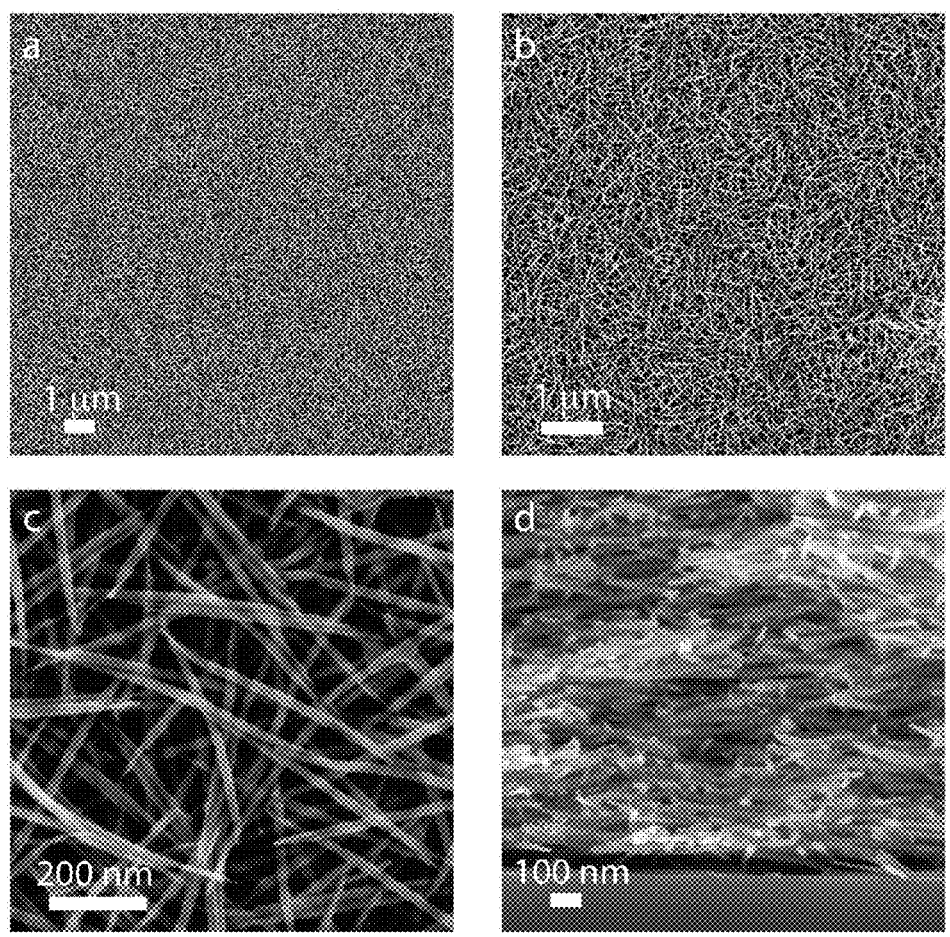
FIG. 8 shows SEM images of drop cast nanocomposite films a) at 5000×, demonstrating uniformity of the films over large areas b) at 10000× and c) 80000× showing the nanorod distribution after film formation d) cross sectional image at 50000× showing preferential orientation of nanorods parallel to substrate.
Figure 9:
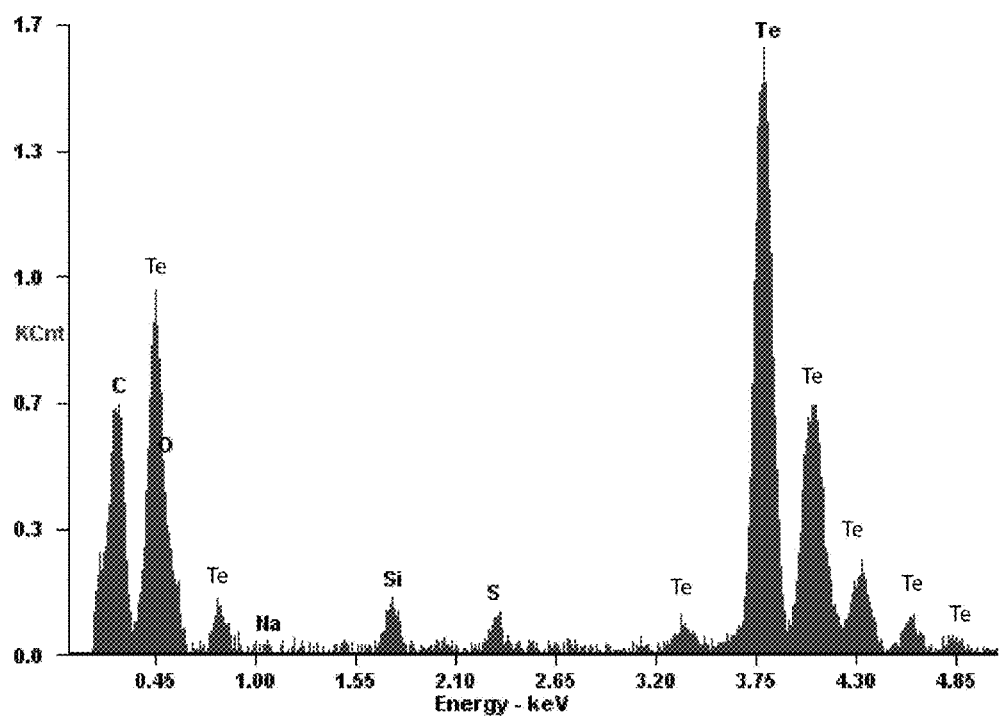
FIG. 9 shows EDAX spectra acquired during SEM imaging, indicating presence of both Tellurium from the nanocrystal and sulfur from the conducting polymer. The Si peak is due to the substrate. The Na peak location is shown as reference, the lack of an identifiable peak indicates effective removal of the starting material, correlating with the trace amount measured from elemental analysis.
Figure 10:
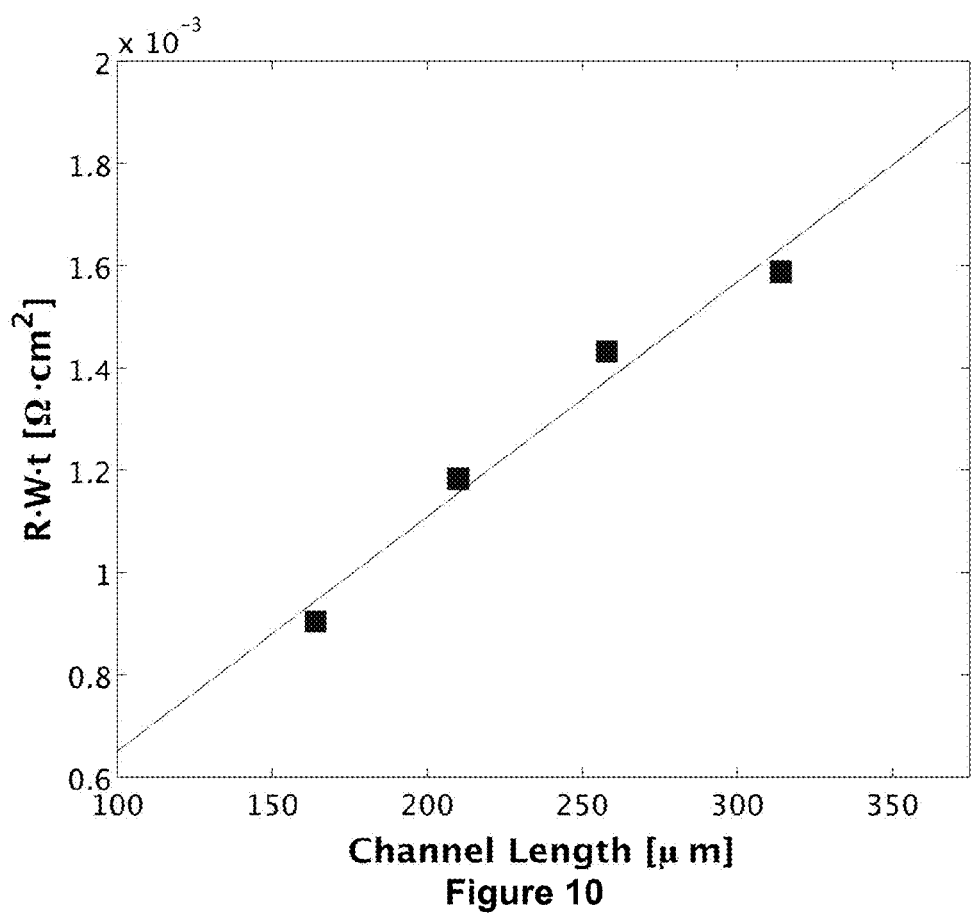
FIG. 10 shows normalized Resistance R as a function of channel length of a nanocomposite film, where W is channel width and t is film thickness. The fit indicates that the normalized resistance scales linearly with R as expected.

The specific material combination chosen was motivated both by optimization of transport properties (both components are p-type with a relative work function offset of ~150 meV[6]) and synthetic facility (all reactants are water-soluble). The relative energy level offset is such that a potential improvement in thermoelectric power factor is possible at room temperature due to a carrier filtering effect.[7] Moreover, conformal polymer coating imparts water solubility to the nanocrystal and allows for both modulation of charge transport at the inorganic/organic interface as well as protection of Te from oxidation. Synthesis of the composite rods utilizes a modified version of a reported synthesis, illustrated in FIG. 3.[8] The resulting nanorods are soluble in water, and can be cast from solution into stable, high quality, smooth films (FIG. 8) either by drop casting or spin casting.

Figure 4:
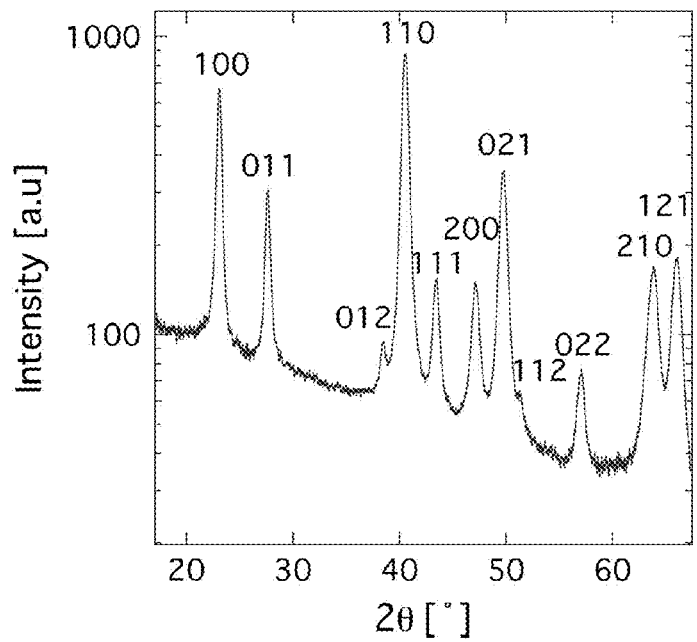
FIG. 4 shows an X-ray diffraction pattern of nanorod film indexed to JCPDS pattern 03-065-3370.
Figure 5:
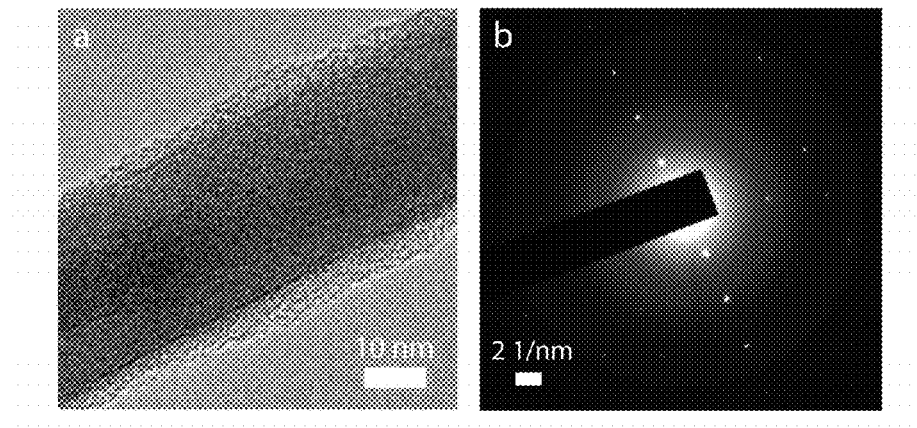
FIG. 5 shows TEM image showing polymer passivation of nanorod along with selected area electron diffraction pattern of nanorod.
Figure 6:
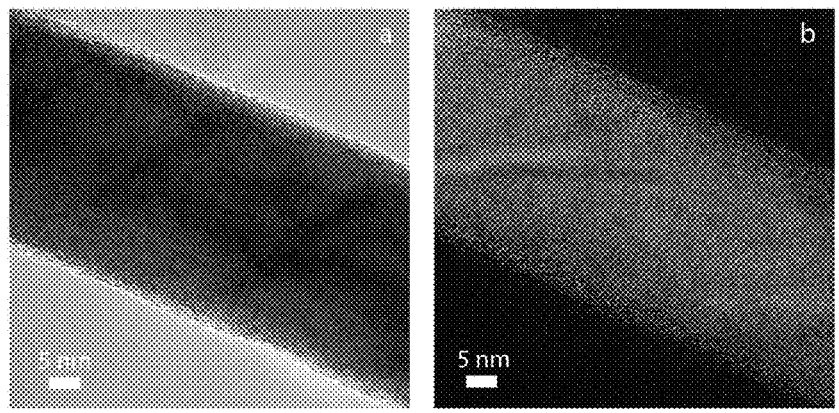
FIG. 6 shows Hi-Res TEM image of composite nanorod and corresponding thickness map acquired via EELS.
Figure 7:
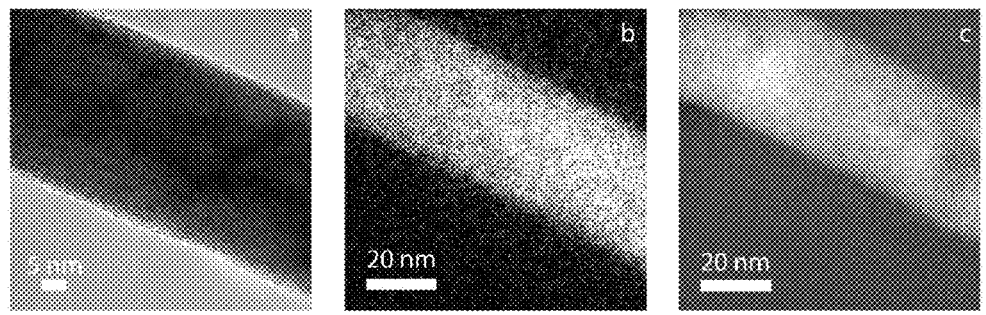
FIG. 7 shows (a) Hi-res TEM image of composite nanorod, (b) Tellurium map, and (c) Sulfur map of same rod acquired using EELS.

The crystallinity of the Te rods was confirmed using X-ray diffraction, shown in FIG. 4. Both surface and cross-sectional scanning electron microscopy (SEM) images (FIGS. 1a and 8) show that the rods are uniformly dispersed throughout the film and predominantly lie with their long axis parallel to the substrate. Transmission electron microscopy and electron energy loss spectroscopy (EELS) confirms that the rods passivated by a thin layer of the conducting polymer (FIGS. 1b, and 5-7).

The composite films display both very high electrical conductivities and thermopowers, confirming that these composite materials capture the beneficial aspects of each component in a single system. Specifically, the conductivities measured are comparable to the most conductive films of single-component colloidal nanostructures reported (>10 S/cm), while the value of the thermopower is an order of magnitude higher than the polymer alone.[9]

Figure 2:
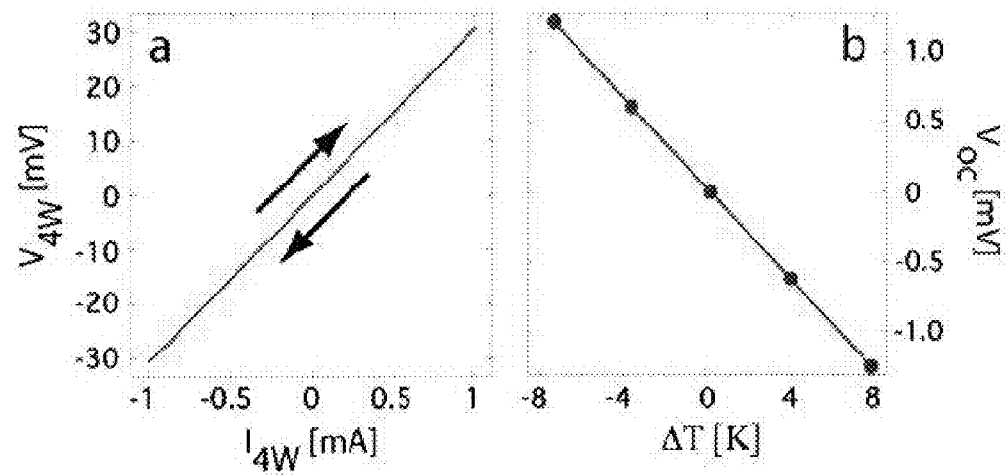
FIG. 2 shows (a) 4-probe current/voltage characteristics of a typical nanorod film in the forward and reverse directions, and (b) open circuit voltage versus applied temperature gradient for a typical nanorod film. The Seebeck coefficient is derived from the slope of the linear fit as noted herein.

FIG. 2a shows representative four-probe I-V curves of a composite film in both the forward and reverse directions. These measurements reveal good ohmic behavior and a definitive lack of hysteresis, a common problem in both organic as well as nanoparticle devices. Measured device performance remains stable over a period of several weeks. A plot showing the measurement of the open circuit voltage $V_{oc}$ as a function of the temperature gradient across the film is shown in FIG. 2b, and shows the expected linear relationship, allowing extraction of the Seebeck coefficient via: $S=-dV_{oc}/dT$. Nanocomposite thermoelectric properties are summarized in Table 1.

TABLE 1

Room Temperature Thermoelectric Properties of Te/Pedot:PSS Nanocomposite Films.

| σ [S/cm] | S [μV/K] | $S^2\sigma_{max}$ [μW/m·K²] | κ [W/m·K] | $ZT_{max}$[a] |
|---|---|---|---|---|
| 19.3 ± 2.3 | 163 ± 4 | 57.3 | 0.088 ± .006 | .19 |

[a]ZT values are calculated using properties measured on the same film

The sign of the Seebeck coefficient is positive and significantly larger than that of the pure polymer, indicating that holes are the majority carrier and that transport does not occur strictly through the PEDOT:PSS. As a result, the films have an excellent power factor $S^2$ (~60 uW/m·K²), while also displaying a remarkably low thermal conductivity (<0.2 W/m·K). The Te/PEDOT:PSS nanorod films display conductivity values and power factors for films already near that of thermally evaporated thin films and even single crystals of Te, indicating the polymer plays an important role in charge transport.[10] The combination gives ZT values ~0.2 at room temperature, noteworthy considering the fact that the system is processed directly from water.

In summary, a water-soluble composite is synthesized with novel thermoelectric transport properties, not captured by any of the individual components. By controlling the organic/inorganic interface we have engineered a system which already has the highest reported ZT of any aqueous processed material, which also provides a clear path towards increasing ZT toward 1. There is ample opportunity to optimize such a system through interface design, for example by varying the degree of PEDOT:PSS passivation and utilizing common doping techniques established for this system.[11] For example, PEDOT:PSS formulations have recently been demonstrated to reach conductivities up to 1000 S/cm, a value approaching the conductivity of doped, polycrystalline $Bi_2Te_3$. In combination with the facile synthesis and processing from a benign solvent such as water, this presents an exciting new platform for both thermoelectrics as well as studying charge transport in nanoscale heterostructures.

Methods and Materials

Chemicals: L-Ascorbic Acid (Aldrich), Sodium Tellurite ($Na_2TeO_3$; 99% Aldrich), PEDOT:PSS (Clevios PH1000, HC Starck). All chemicals are used as received without further purification.

Preparation of Te/PEDOT:PSS nanorods: A typical synthesis involves dissolution of 1 g Ascorbic Acid (Aldrich) in 40 ml >18 MΩ-cm $H_2O$ followed by addition of 1 ml PEDOT:PSS (Clevios PH1000, HC Starck) filtered through a PVDF 0.45 um syringe filter. Then ~70 mg $Na_2TeO_3$ is added to the vigorously stirring mixture. The mixture is then raised to ~90° C. and held overnight. Clean up consists of taking the crude reaction mixture and centrifuging at 9000 rpm for 30 min, pouring off the PEDOT:PSS rich supernatant, redispersing in ultra pure water and centrifuging again. The supernatant is discarded and the final product is resuspended in ultra pure water and then dropcast into films for measurements. All substrates were cleaned in UV/ozone prior to film deposition.

Preparation of Te nanowires (Te nw) and control films: Te nanowires were synthesized in an identical manner to the composite nanorods only in the absence of PEDOT:PSS. Films were drop cast on to quartz substrates and dried at ~120° C. in air. Silver paint was applied for both Seebeck and electrical conductivity measurements. Reported values for conductivity are based on four different devices and Seebeck values are based on independent measurements on four different films.

Preparation of PEDOT:PSS Control films: Clevios PH1000 was spin cast on to quartz substrates in air and gold electrodes were subsequently evaporated in varied channel length configuration for both Seebeck and electrical conductivity measurements. Reported values for conductivity are based on four different devices and Seebeck values are based on independent measurements on three different films.

Electrical Conductivity and Seebeck Coefficient Measurements: Electrical conductivity was measured using a Keithley 2400 Sourcemeter in both 4 wire van der pauw configuration and with 2 wire measurements on narrow channel lengths. There were a total of 11 independent measurements of conductivity across 4 different substrates which contributed to the values shown in Table 1. For 2 wire measurements, 8 pairs of Au electrodes with different channel lengths ranging from 150 to 300 μm were deposited on films fabricated on quartz substrates. For combined electrical and thermal measurements, nanorods were drop cast onto sapphire substrates, dried at 120° C. for ~20 minutes after which silver paint electrodes (Leitsilber 200, Pella) were applied at the corners in a van der pauw configuration. *Note: insulating substrates were selected in order to ensure that the measured film properties were due to the nanocomposite film alone. Average film thicknesses were typically between 2-4 μm. Four-probe electrical conductivity and thermopower were measured and then samples were further processed for thermal conductivity measurements as described in the following section.

Thermopower was measured using a homemade setup consisting of two peltier devices (Ferrotec) spaced ~4 mm apart. Current was driven through the devices in opposing polarities, resulting in a temperature gradient about room temperature which varied with the magnitude of the current. The temperature of the sample was measured using two T type thermocouples mounted in micromanipulators. Thermal contact was ensured by utilizing silicon thermal paste (Wakefield Thermal Solutions). Typically, 5 different gradients were employed, with 10 voltage samples taken and averaged using an Agilent 34401 multimeter with an equilibration time of 200 seconds between temperature changes. Data for both conductivity and thermopower were acquired using homemade Labview programs.

Thermal Conductivity: Thermal conductivity was measured using the 3-Omega method (Cahill, D. G. *Review of Scientific Instruments* 1990, 61, 802-808) with the differential technique. Samples were prepared by drop-casting the nanocomposite film of interest on Si or Sapphire substrates, vapor depositing a ~200 nm dielectric layer of n-Parylene, and thermal evaporation of a ~70 nm thick Au through a 1 mm×30 um lift-off pattern made by photolithography. This Au line serves as a combined Joule-heater/resistive-thermometer. In accordance with the differential method, a reference sample was prepared similarly and simultaneously, but without the nanorod film, in order to subtract the thermal contribution of the substrate and dielectric layer; due to the thickness of the sample, 2D heat spreading in the film was accounted for using the data reduction technique of Borca-Tasciuc et al. (*Review of Scientific Instruments* 2001, 72, 2139-2147). Each heaterline used for measurement was inspected for dielectric leakage to the substrate and to the adjacent heaters; no leakage was observed to within the limits of detectability (>120 MOhms). Each heater/thermometer was calibrated from 20° C.-35° C., in order to determine its temperature coefficient of resistance. Film thickness was measured after the experiment by scratching the sample adjacent to the heater-line and using a KLA-Tencor Alpha-Step IQ surface profiler. Measurements were obtained on 7 separate heater lines across 4 different substrates.

Materials Characterization: Scanning electron microscopy (SEM) images and Energy dispersive X-ray spectra (EDAX) were obtained using a Zeiss Ultra 55 SEM (FE-SEM, Germany) equipped with an EDAX spectrometer. Samples for SEM were prepared by dropcasting the nanocomposite from water on to silicon substrates. Cross sectional SEM images were obtained by cleaving the substrates after deposition and imaging the samples edge on. Transmission electron microscopy (TEM) images and electron energy loss (EELS) elemental maps were obtained on both a JEOL 2100 and a JEOL 2100F (FETEM) operated at 200 kV equipped with an EELS attachment. Samples for TEM were prepared by dropping aqueous solutions of nanocomposite on lacey carbon grids (Pella). X-ray diffraction patterns were recorded on a Bruker D8-Advance x-ray diffractometer equipped with a GADDS area detector operated at 40 kV and 20 mA using Cu Kα alpha radiation (1.54 Å). Elemental analysis (Table 2) was obtained from Columbia Analytical Services (Tellurium—Flame Atomic Absorption Spectrometery, Sodium—ICP-OES) on nanocomposite solid dried in a vacuum oven overnight.

Device and Materials Properties

Figure 11:
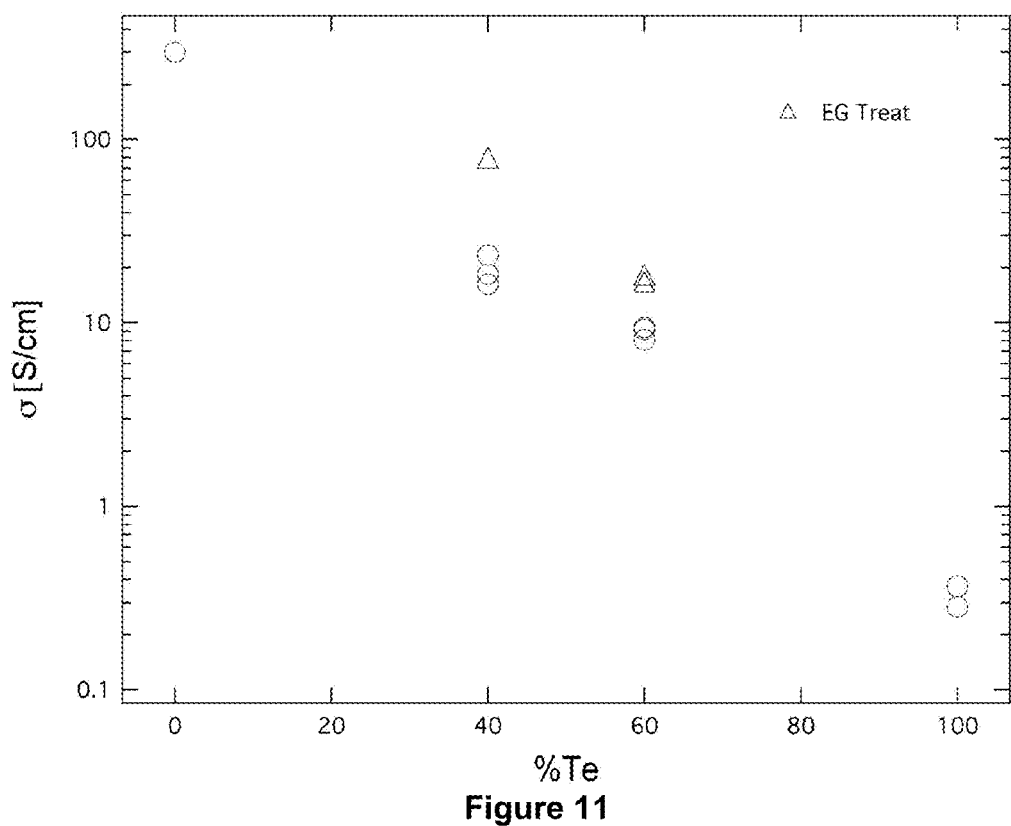
FIG. 11 shows the conductivity of composite films as function of Tellurium loading. Endpoints are pure polymer and Tellurium films respectively.
Figure 12:
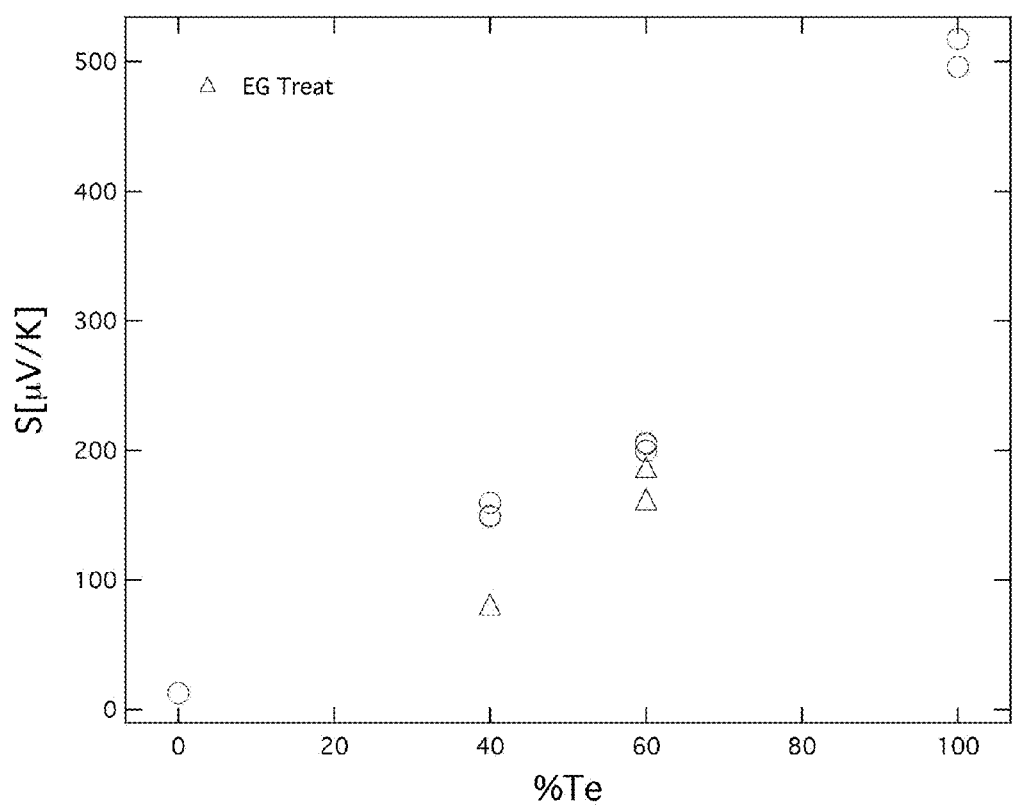
FIG. 12 shows the thermopower of composite films as function of Tellurium loading. Endpoints are pure polymer and Tellurium films respectively.
Figure 13:
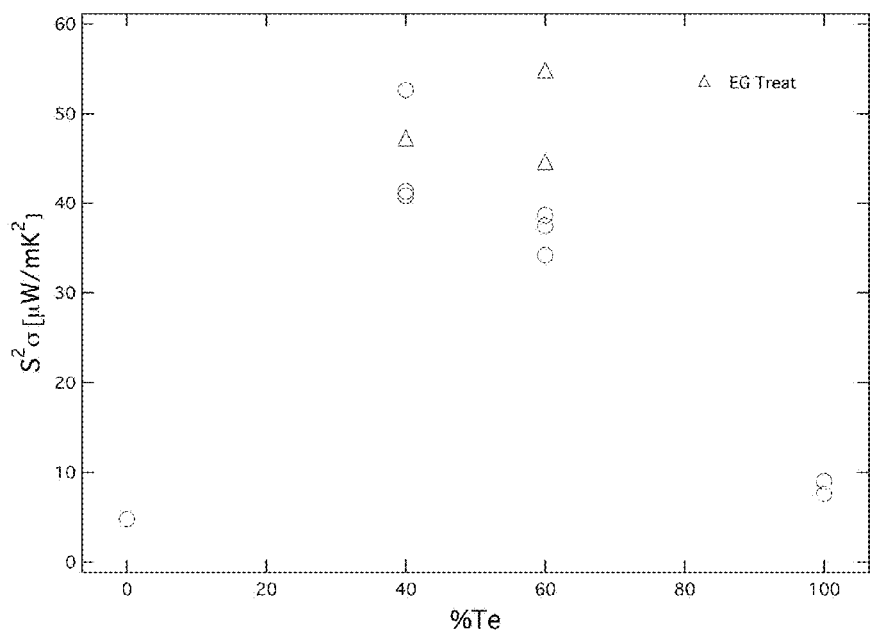
FIG. 13 shows the power factor of composite films as function of Tellurium loading. Endpoints are pure polymer and Tellurium films respectively.
Figure 14:
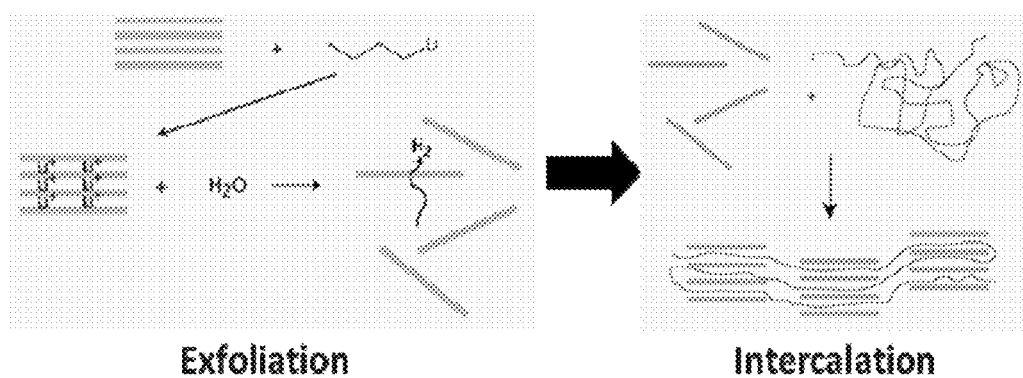
FIG. 14 shows a schematic of the exfoliation/intercalation reactions.
Figure 15:
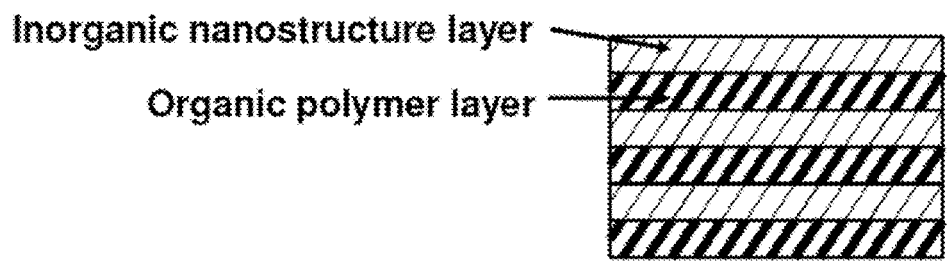
FIG. 15 shows a schematic drawing of one embodiment of the heterostructure.

The conductivity, thermopower, and power factor of the composite films as function of Tellurium loading are determined (see FIGS. 11-13). These results clearly show that the composite films provide an improvement in power factor versus either the polymer or inorganic films alone. The system is also flexibly doped by soaking films in polar solvent such as ethylene glycol in various concentrations which can be varied to achieve maximum power factors. Thermal conductivity of the films has also been measured using the 3ω) technique, giving values in the range typical for polymers, ~0.17 W/m K, which give ZT values at room temperature around 0.1. There are clear paths toward improving ZT which are expected with further optimization of synthetic conditions, doping, and annealing.

TABLE 2

Elemental Analysis of Te/PEDOT:PSS nanorods

| Material | C (%) | S (%) | O (%) | Na (%) | Te (%) |
|---|---|---|---|---|---|
| Te/PEDOT:PSS | 5.32 | .973 | 5.69 | .39 | 86.47 |

EXAMPLE 2

Rod Length Dependence

Figure 19:
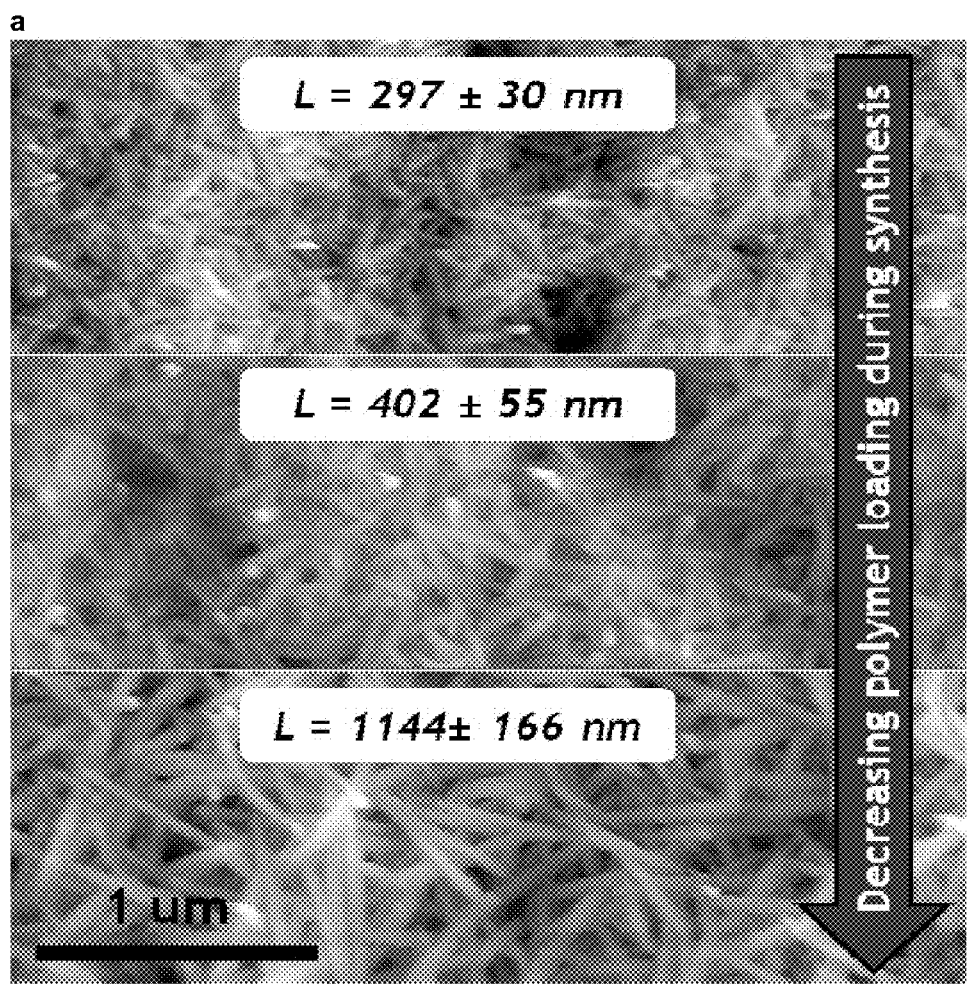
FIG. 19 shows AFM images of rod morphologies controlled by varying the polymer loading (a). The control of rod morphology and the effects on Seebeck coefficient (b), conductivity (c), and power factor (d).

The morphological size control of the Te nanorods affords tuneability and control of the electrical, thermal, and thermoelectrical properties of composite films. Specifically, by varying the amount of PEDOT:PSS during the initial synthesis, the length of Te nanorods can be predictably controlled. Using the aforementioned technique, rods of length 100-2000 nm have been synthesized and both longer and shorter rods can be synthesized as well using the same technique. Electrical conductivity and thermopower measurements observe a monotonically increasing trend as the rods become longer. This is unique to this system because, in most materials, the thermopower and electrical conductivity have competing trends. For example, in most materials, as the thermopower increases, the electrical conductivity decreases; in our system, however, thermopower and electrical conductivity can simultaneously be increased. This implies that even higher power factors and ZT values can be achieved. To date, by simply controlling the length of the rods, power factors as high as 97 $\mu W/m\text{-}K^2$ have been measured. This suggests a ZT of 0.3 at room temperature can readily be achieved without further optimization. The implications of this invention allow for ZT, electrical conductivity, thermopower, and thermal conductivity to be controlled not only by chemical means but also by controlling the physical morphological attributes. This provides a unique path forward for controlling thermal and electrical properties that are not afforded in other systems. This invention also allows for additional control not realizable by other systems thus opening additional applications including but not limited to: spot-cooling, large areal power generation, small (micro) sensor power generation, premium mobile power generation, premium mobile cooling, thermal-electrical switching, thermal electrical transistors, and thermal-electrical pumping. See FIG. 19.

Paths Towards High ZT

Figure 20:
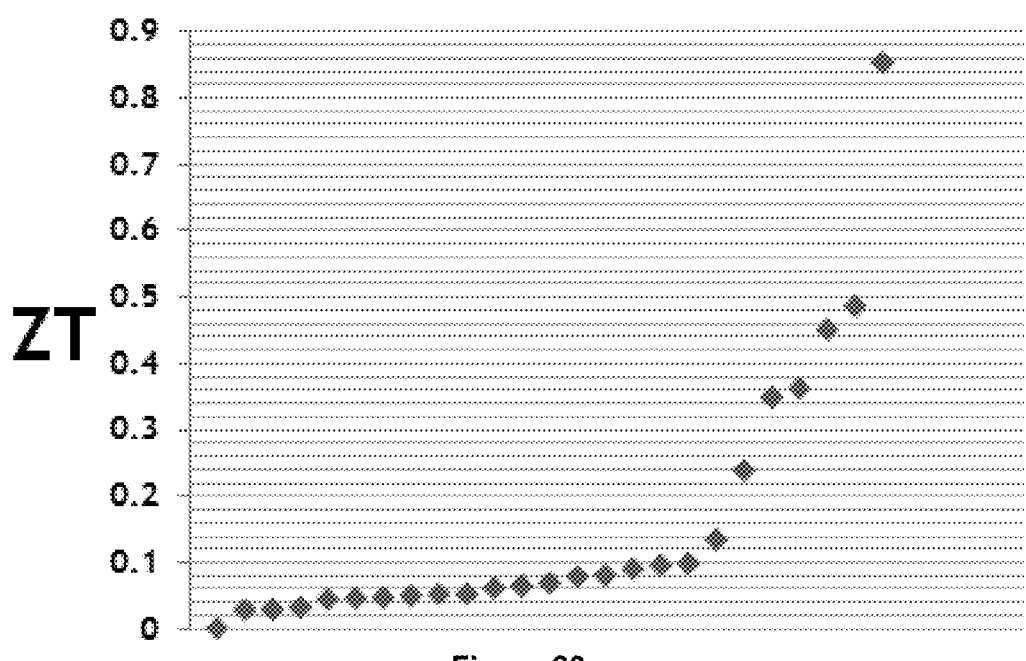
FIG. 20 shows improvements in ZT for samples of various morphology and polymer-Te loading.

The present invention provides unique pathways for obtaining high ZT that cannot be achieved in ordinary polymer systems. By controlling the morphology of the rods in coordination with the optimum polymer-Te loading, ZTs higher than 0.8 at room temperature have been achieved to date. Other techniques for increasing ZT include but are not limited to the following: (i) increase electrical conductivity and thermopower by in situ solvent doping during synthesis (such suitable solvents include, but are not limited to, ethylene glycol and DMSO, which have been shown to increase the electrical conductivity of films; Kim, Y. H. et al. Highly Conductive PEDOT:PSS Electrode with Optimized Solvent and Thermal Post-Treatment for ITO-Free Organic Solar Cells. Advanced Functional Material, Vol. 21(6): 1008-1200 (2011)), (ii) increase electrical conductivity and thermopower by post filling with high conductivity polymers such as doped polyacetylene or doped polyalkylthiophene, and (iii) decrease thermal conductivity by anisotropic alignment of rods (using drying/annealing kinetics, electric fields, magnetic fields, or physical gradient) in a direction orthogonal to that of electronic transport. See FIG. 20.

Considerations for Choice of Materials for Composite

Figure 21:
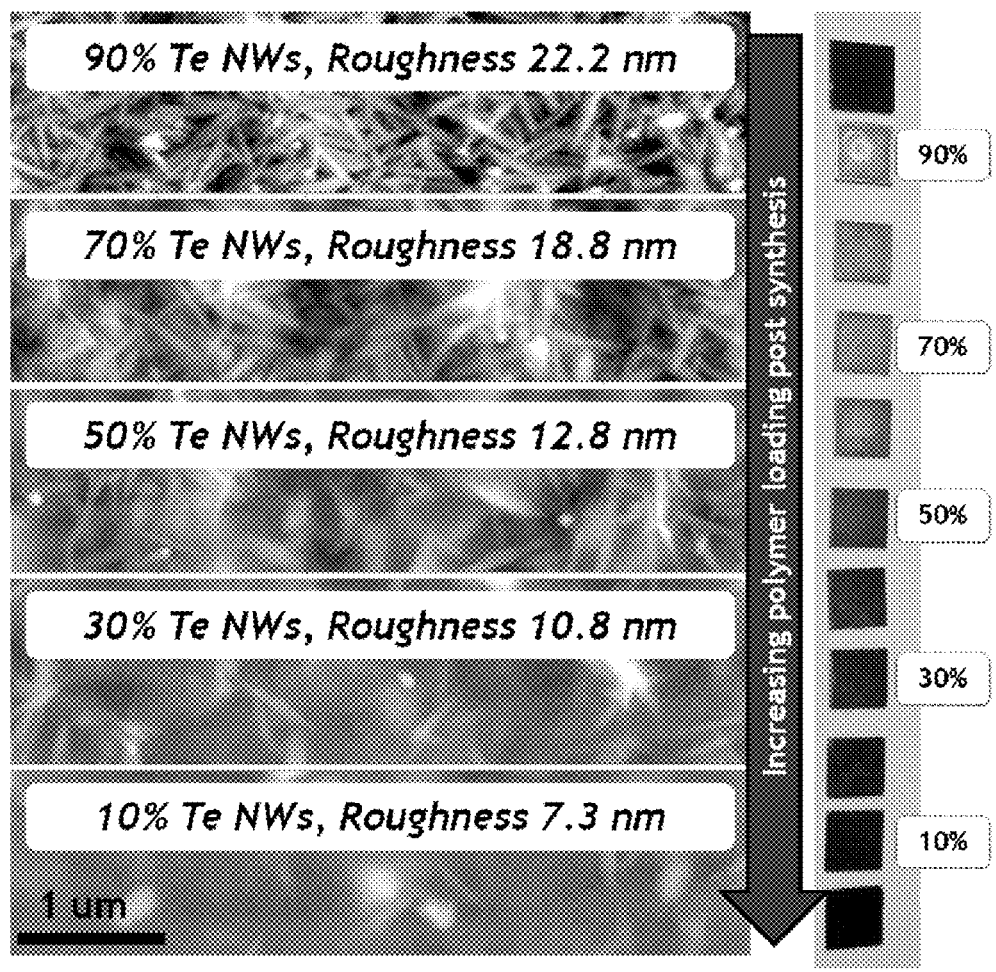
FIG. 21 shows control of polymer-Te loading and the affect on surface roughness.

The energy level alignment between the component materials in the organic-inorganic composite is critical for the optimization of thermoelectric figures of merit. If these hybrid materials self-assemble in such a way that charge transport behaves like a molecular junction, the Seebeck coefficient and electrical conductivity can be simultaneously optimized. The optimized case occurs when the Fermi energy of the crystalline inorganic material and highest occupied molecular orbital (HOMO) of the organic material are within a factor of a few $k_BT$ of each other. A second consideration in the choice of materials for the organic-inorganic composite is the type of carrier conduction that occurs in the materials. In a system that does not take advantage of molecular junctions, the diffusion of n-type or p-type carriers in the component material leads to either a positive (p-type), or negative (n-type) Seebeck coefficient. In order to maximize the thermovoltage, the component materials should exhibit predominantly the same type of carrier conduction. In a molecular junction system, the component materials also should exhibit predominantly the same type of carrier conduction, which along with alignment between the energy levels of the organic and inorganic components, enables efficient carrier transport, and hence a high electrical conductivity in the thermoelectric composite. Finally, we note that the choice for the components in a hybrid organic-inorganic material, is that either component can play the role of either the metal or semiconductor material. Solution-processable organic metals can be matched with a solution-processable inorganic semiconductors, or vice-versa, and as long as molecular junctions are being formed, the thermoelectric properties can be simultaneously optimized. See FIG. 21.

Dependence of Thermoelectric Properties on the Composition of Nanocrystal-Polymer Films The ability to inexpensively and easily control the relative amounts of polymer and inorganic nanocrystal in the composite films enables a degree of tunability for the films' thermoelectric properties. The electrical and thermal conductivities, as well as the Seebeck coefficient of the films all depend on composition. With broad control over these parameters, in addition to being able to vary the film composition to maximize the thermoelectric figure of merit ZT, these systems are able to be easily optimized for specific applications, where for example a higher electrical conductivity would be preferable to a higher overall thermoelectric power conversion efficiency.

Figure 22:
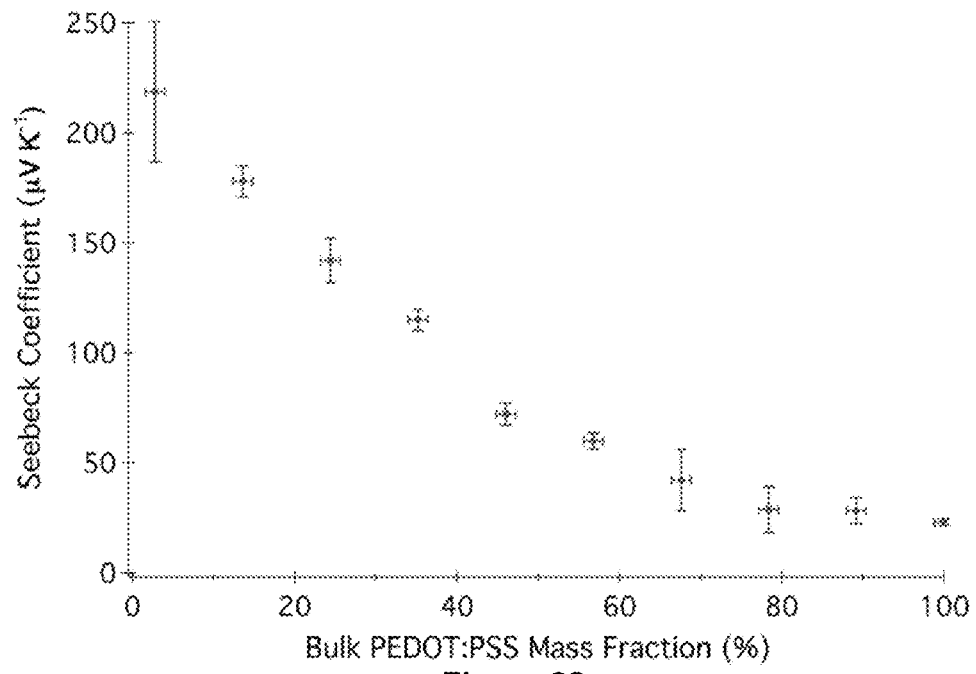
FIG. 22 shows variation of Seebeck coefficient with additional polymer content.
Figure 23:
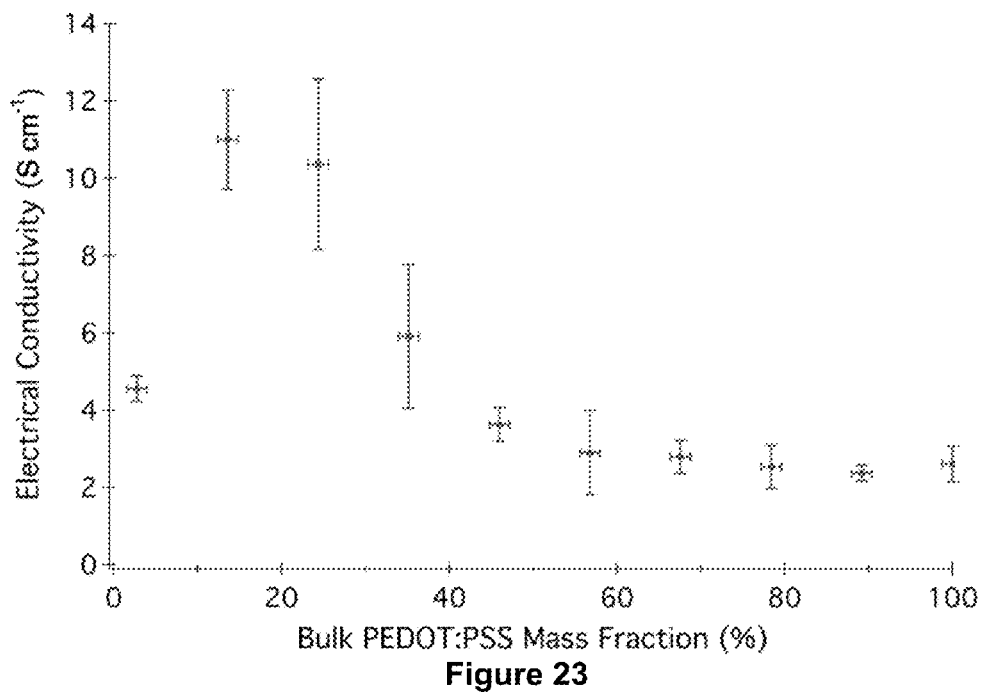
FIG. 23 shows electrical conductivity as a function of mass fraction of additional polymer.
Figure 24:
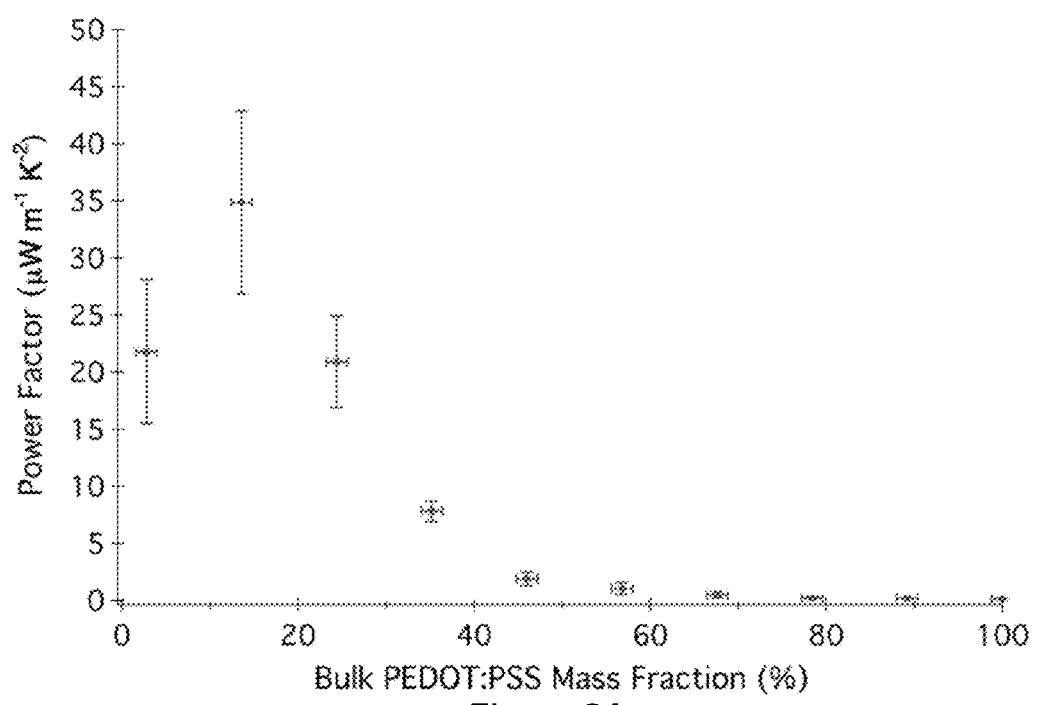
FIG. 24 shows thermoelectric power factor as a function of added PEDOT:PSS mass

The simple and highly controlled tuning of the composition, and hence thermoelectric properties of nanocrystal-polymer films has been demonstrated with the Tellurium-PEDOT:PSS system that we have studied. In order to vary the composition of these films, the PEDOT:PSS coated Te nanostructures were synthesized, and their concentration in solution was measured. Then, this initial solution of Te nanostructures was mixed in various volumetric ratios with a PEDOT:PSS solution with known concentration. These final solutions were used to cast films, whose thermoelectrics properties were then measured. FIG. 22 shows the dependence of Seebeck coefficient on the mass fraction of added PEDOT:PSS in the composite film, and demonstrates that the Seebeck coefficient monotonically decreases with increasing polymer content. FIG. 23 displays the electrical conductivity of the films as a function of the mass fraction of added PEDOT:PSS, and displays a maximum near 30% additional polymer mass. FIG. 24 shows the variation of thermoelectric power factor for these Te-PEDOT:PSS composite films as a function of additional polymer. Here, we see that the optimized condition for this morphology of nanorods when ~15% of the mass of the film is additional polymer. FIGS. 22-24 demonstrate the ability to control the relative amounts of polymer and inorganic nanostructure in the solution-processed thermoelectric films. This ability enables facile and inexpensive tuning of the films' thermoelectric properties, providing a route for enhancement and optimization of the thermoelectric figure of merit ZT, or a different metric that might be desirable for specific applications.

This invention has been described herein in considerable detail to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. A device comprising:
a first layer, the first layer being a thermoelectric material having a thermoelectric figure of merit ZT of equal to or greater than about 0.1 at room temperature, the first layer comprising:
a plurality of inorganic nanostructures, the plurality of inorganic nanostructures having an average length of about 50 nanometers to 2000 nanometers, each nanostructure of the plurality of inorganic nanostructures having a ratio of a length to a radius of equal to or more than 2, each nanostructure of the plurality of nanostructures comprising a nanorod, nanostructures of the plurality of nanostructures comprising tellurium; and
an organic polymer disposed on surfaces of each nanostructure of the plurality of inorganic nanostructures, the organic polymer being electrically conductive, the organic polymer being poly(3,4-ethylenedioxythiophene) poly(styrenesulfonate) (PEDOT:PSS), the organic polymer forming a layer about 2 nanometers thick on the surfaces of each nanostructure of the plurality of inorganic nanostructures;
a weight percentage of the organic polymer in the first layer being about 15% and a weight percentage of the plurality of inorganic nanostructures in the first layer being about 85%.

2. The device of claim 1, wherein the plurality of inorganic nanostructures and the organic polymer are water-soluble or solution-processable.

3. The device of claim 1, further comprising:
a second layer disposed on the first layer, the second layer comprising the organic polymer.

4. The device of claim 3, wherein a thickness of the second layer is about 2 nanometers to 4 nanometers.

5. The device of claim 3, wherein a thickness of the second layer is about 3 nanometers.

6. The device of claim 1, wherein the organic polymer has an electrical conductivity equal to or greater than 1 S/cm.

7. The device of claim 1, wherein the organic polymer has an electrical conductivity equal to or greater than 10 S/cm.

8. The device of claim 1, wherein the organic polymer has an electrical conductivity equal to greater than 100 S/cm.

9. The device of claim 1, wherein the first layer is fabricated using a process selected from a group consisting of printing, spray coating, drop-casting, and roll-to-roll processing.

10. The device of claim 1, wherein the first layer has a ZT of equal to or greater than about 0.2 at room temperature.

11. The device of claim 1, wherein the first layer has a ZT of equal to or greater than about 0.3 at room temperature.

12. The device of claim 1, wherein the first layer has a ZT of equal to or greater than about 0.8 at room temperature.

13. The device of claim 1, wherein the first layer has a ZT of equal to or greater than about 1.0 at room temperature.

* * * * *